(12) United States Patent
Estes et al.

(10) Patent No.: US 7,010,183 B2
(45) Date of Patent: Mar. 7, 2006

(54) SURFACE PLASMON DEVICES

(75) Inventors: Michael J. Estes, Longmont, CO (US); Garrett Moddel, Boulder, CO (US)

(73) Assignee: The Regents of the University of Colorado, Boulder, CO (US)

( * ) Notice: Subject to any disclaimer, the term of this patent is extended or adjusted under 35 U.S.C. 154(b) by 357 days.

(21) Appl. No.: 10/103,054

(22) Filed: Mar. 20, 2002

(65) Prior Publication Data

US 2003/0179974 A1    Sep. 25, 2003

(51) Int. Cl.
*G02B 6/12* (2006.01)
*H04B 10/06* (2006.01)
*H01S 3/04* (2006.01)

(52) U.S. Cl. ............ 385/14; 385/1; 385/2; 385/129; 385/130; 385/131; 385/37; 398/212; 398/214; 359/333; 359/337.1; 359/337.21; 372/43.01; 372/44.01; 372/46.011; 372/50.1; 372/50.11

(58) Field of Classification Search .......... 385/1, 385/2, 3, 14, 49, 31, 88, 92, 129, 130, 131, 385/37; 398/212, 214; 359/333, 337.1, 359/337.21; 372/43.01, 44.01, 46.011, 50.1, 372/50.11

See application file for complete search history.

(56) References Cited

U.S. PATENT DOCUMENTS

| | | | |
|---|---|---|---|
| 4,163,920 A | | 8/1979 | Lamb et al. |
| 5,067,788 A | * | 11/1991 | Jannson et al. ............... 385/2 |
| 6,034,809 A | | 3/2000 | Anemogiannis |
| 6,442,321 B1 | * | 8/2002 | Berini .......................... 385/130 |
| 6,614,960 B1 | * | 9/2003 | Berini .......................... 385/39 |
| 2003/0059147 A1 | * | 3/2003 | Berini .......................... 385/2 |
| 2003/0179974 A1 | * | 9/2003 | Estes et al. ................... 385/2 |

OTHER PUBLICATIONS

N.A. Janunts et al., "Modulation of light radiation during input into waveguide by resonance excitation of surface plasmons," Appl. Phys. Lett., vol. 79, No. 3, pp. 299-301 (2001).

Korotkov et al., "TASERS: Possible DC pumped terahertz lasers using interwell transitions in semiconductor heterostructures," Appl. Phys. Lett., vol. 65, No. 15, pp. 1865-1867 (1994).

Drexler et al., "Photon-assisted tunneling in a resonant tunneling diode: stimulated emission and absorption in the THz range," J. of Appl: Phys., vol. 67, No. 19, pp. 4102-4104 (1995).

Kempa et al., "Towards stimulated generation of coherent plasmons in nanostructures," J. Appl. Phys, vol. 85, No. 7, pp. 3708-3712 (1999).

(Continued)

Primary Examiner—Brian M. Healy
(74) Attorney, Agent, or Firm—Michael Pritzkau; Yoriko Morita

(57) ABSTRACT

A device including an input port configured to receive an input signal is described. The device also includes an output port and a structure, which structure includes a tunneling junction connected with the input port and the output port. The tunneling junction is configured in a way (i) which provides electrons in a particular energy state within the structure, (ii) which produces surface plasmons in response to the input signal, (iii) which causes the structure to act as a waveguide for directing at least a portion of the surface plasmons along a predetermined path toward the output port such that the surface plasmons so directed interact with the electrons in a particular way, and (iv) which produces at the output port an output signal resulting from the particular interaction between the electrons and the surface plasmons.

59 Claims, 20 Drawing Sheets

OTHER PUBLICATIONS

Asada et al., "Estimation of interwell terahertz gain by photon-assisted tunneling measurement in triple-barrier resonant tunneling diodes," Appl. Phys. Lett., vol. 77, No. 5, pp. 618-620 (2000).

Tredicucci et al., "Surface plasmon quantum cascade lasers at 1 ~ 19 mm," Appl. Phys. Lett., vol. 77, No. 15, pp. 2286-2288 (2000).

Volkov et al., "Tunneling-assisted photon emission in MIM junctions," Physics Stat. Sol. (b), 163.611 (1991).

Aleksanyan et al., "Feasibility of developing a tunable oscillator utilizing a system of metal-barrier-metal-barrier-metal junctions," Sov. J. Quan. Elec., vol. 11, No. 5, pp. 635-637 (1981).

Belenov et al., "Investigation of the radiation emitted by metal-barrier-metal structures," Sov. J. Quan. Elec., vol. 13, No. 4, pp. 451-455 (1983).

Siu et al., "Stimulated electrun tunneling in metal-barrier-metal structures due to surface plasmons," Appl. Phys. Lett., vol. 28, No. 7, pp. 407-410 (1976).

Drury et al., "Theory of Infrared and optical frequency amplification in metal-barrier-metal diodes," IEE Trans. On Microwave Th. And Tech., vol. MTT-27. No. 6, pp. 598-603 (1979).

Drury et al., "A stimulated inelastic tunneling theory of negative differential resistance in metal-insulator-metal diodes," IEEE J. of Quan. Elec., vol. QE-16, No. 1, pp. 58-69 (1980).

Belenov et al., "Resonant tunneling in multilayer structures in the presence of surface electromagnetic waves," Sov. Tech. Phys. Lett., vol. 12, No. 4, pp. 200-202 (1986).

Belenov et al., "Emission of surface electromagnetic waves in the case of resonance tunneling of electrons," Sov. J. Quan. Elec., vol. 17, No. 10 (1987).

Belenov et al., "Amplificationof surface plasma oscillations in complex metal-barrier-metal structures," Sov. J. Quan. Elec., vol. 12, No. 7 (1982).

Xie, "Stimulated emission of surface plasmons in metal-insulator-metal (transition metal type like) structures," Infrared Phys., vol. 25, No. 5, pp. 661-664 (1985).

Schildkraut, "Long-range surface plasmon electro optic modulator," Applied Optics, vol. 27, No. 21, pp. 4587-4590 (1988).

* cited by examiner

SURFACE PLASMON DEVICES

BACKGROUND OF THE INVENTION

The present invention relates to surface plasmon devices and methods of making such devices and, more specifically, to surface plasmon guided wave devices whose optical frequency response is not limited by RC time constant.

One of the disadvantages of conventional electronic devices based on electron charge oscillation is that they cannot operate at terahertz frequencies or higher due to time constant limitations. In tunneling junction devices, for example, the speed of the device is limited by the fact that the outer conductive layers of the tunneling junctions act as parallel plate capacitors. Coupled with the internal and external resistance to current flow, the RC time constant constrains the speed of the tunneling junction device. Thus, only very small devices, which have correspondingly small capacitance, can be operated at optical frequencies of $10^{13}$–$10^{15}$ Hz.

One way to circumvent the RC time constant limitation and get optical frequency response from these devices is to use traveling waves. In metal-insulator based structures, such as metal-insulator-metal tunnel junctions, surface plasmons provide such a solution. Surface plasmons are TM electromagnetic modes which propagate along the interface between two materials having dielectric constants of opposite signs, such as the interface between a metal and a dielectric material or the interface between a metal and a semiconductor. The use of surface plasmons as a means of transferring and manipulating electromagnetic energy in a device is advantageous because the electromagnetic energy is tightly confined when in the form of surface plasmons. Therefore, small, compact devices for controlling electromagnetic energy are enabled by taking advantage of the properties of surface plasmon propagation.

Research into devices based on surface plasmon transmission has focused on devices formed of semiconductor materials and on devices formed of metal-insulator combinations. Studies on semiconductor structures have centered mainly on resonant tunneling diode structures based on multiple quantum wells. For example, Korotkov et al. examine the theoretical possibility of lasing from double quantum well (or triple-barrier) heterostructures.[1] Korotkov et al. describe the use of radiative, interwell transitions (i.e., inelastic tunneling between adjacent quantum wells) to achieve lasing. Korotkov et al. also suggest the minimization of absorption of terahertz radiation in doped gallium-arsenide by using periodically-spaced p+ and n+ doped injection layers.

Whereas the paper of Korotkov et al. is based on theory, Drexler et al. discuss experimental behavior of a semiconductor triple-barrier resonant tunneling diode (RTD) with a bowtie antenna.[2] Drexler et al. observed evidence of stimulated absorption and emission of terahertz fields in the I-V curve of their experimental device, indicating photon-assisted tunneling (which they interpret as stimulated absorption of photons) in the RTD. Drexler et al. further suggest that the device may be adopted to design tunable quantum detectors and radiation sources in the terahertz radiation range.

An approach toward attaining gain in solid state plasmas in semiconductor structures is discussed by Kempa et al.[3] The article of Kempa et al. discusses the possibility of attaining growing coherent plasma oscillations (i.e., plasma instability or stimulated emission of plasmons) using quantum well structures with the aim of fabricating a terahertz source based on the resulting gain. By interpreting the experimental and theoretical nonlinearity of the I-V curve of their semiconductor devices, Kempa et al. assert the presence of population inversion and predict the achievement of stimulated emission of plasmons using their semiconductor structure scheme if the structure is optimized.

Estimated gain in a triple barrier (i.e., double quantum well) RTD structure is discussed by Asada et al.[4] By separating the photon absorption and stimulated emission peaks from the total current curve in the I-V characteristics of the device, Asada et al. estimate the net stimulated emission rate of the tunneling electrons as a function of bias voltage. Thus, Asada et al. calculate the estimated intersubband terahertz gain and predict that high gain is possible in the device by increasing the current density in the device as well as by using thin barriers.

A surface plasmon quantum cascade (QC) laser based on chirped semiconductor superlattices has been demonstrated by Tredicucci et al.[5] The surface plasmon QC laser of Tredicucci operates at a wavelength of $\lambda$~19 $\mu$m, and relies on guided surface plasmon modes at a metal-semiconductor interface to effectively confine the infrared wavelength light. The surface plasmon QC laser is operable up to a maximum temperature of 145K.

Semiconductor-based devices have several drawbacks. Due to their crystalline nature and the fact that deposited semiconductor layers must epitaxial, semiconductor-based devices are relatively expensive to fabricate and very difficult to integrate with other optoelectronic devices. In addition, semiconductor carrier concentration is limited to $<10^{20}$ $cm^3$, which is about 1000 times lower than in metals. One consequence of the lower carrier concentration is that the plasma frequency is reduced from optical frequencies to millimeter wave frequencies, so that optical waves cannot be carried by semiconductor surface plasmons. Another consequence is that the device bandwidth is reduced due to transport resistance. Still another consequence for amplification and emission devices is that the increased resistance would limit the output intensity and increase heating.

An alternative to semiconductor-metal structures is the use of a metal-insulator interface to confine the surface plasmons. Metal-insulator layers are relatively inexpensive to manufacture in comparison to semiconductor-based systems. As the oxides of metals are generally used as the insulator materials, structures including metal-insulator interfaces are straightforward to fabricate compared to the epitaxial growth techniques for semiconductor layers. Due to the high carrier concentration in metals and the extremely short transit time of tunneling electrons, metal-insulator-metal (MIM) tunneling junctions are potentially useful in devices for optical frequency electronics.

Research on surface plasmons in MIM devices published in the 1970's and 1980's focused largely on developing an understanding the properties of point contact tunneling junctions, which were shown to detect infrared and millimeter wave radiation, and on light-emitting tunneling junctions, which give off a broad spectrum of spontaneously-emitted visible and infrared radiation.

An emitter based on the MIM diode structure is disclosed by Lambe et al. in U.S. Pat. No. 4,163,920.[6] The emitter of Lambe includes a strip of metal, with an oxide formed thereon, and a second metal strip crossing the first metal strip and oxide, thus forming an MIM structure at the intersection of the two metal strips. The top surface of the second metal strip is roughened such that the second metal strip is rendered slightly porous. By applying a current across the two metal strips, Lambe et al. achieve light emission from the excitation of surface plasmons in the tunneling junction due to inelastic tunneling of electrons. In other words, the emitter of Lambe et al. is essentially a broadband emitter in the visible spectrum with the light being emitted from the roughened surface of the MIM junction.

The emitter as described in Lambe et al. has a number of drawbacks. One such drawback is the relatively inefficient spontaneous emission process of surface plasmons in single-insulator MIM diodes. For example, Volkov and Chuiko estimate the efficiency of this transition to be $\sim 10^{-4}$.[7] To improve the spontaneous emission efficiency, Aleksanyan et al. investigated insulator structures with one or more quantum wells in which the quantized energy levels inside the potential wells limit the available tunneling states to those for inelastic tunneling in which a surface plasmon is generated.[8] A problem with embodiments in the literature devices based on multiple quantum well structures is the non-uniformity of the barrier and quantum well layers. As another approach, Belenov et al. demonstrated enhanced light emission in evaporated MIMIMIM triple-barrier diodes over single-barrier diodes.[9] However, Belenov et al. attribute the increased light intensity to increased scattering in the films with additional layers. It is submitted that traditional thin film deposition techniques, such as evaporation, are not well suited for growing very thin (<5 nm) uniform layers of amorphous materials due to the difficulty in controlling the uniformity of layers. Another drawback of the Lambe device is the inefficient output coupling of surface plasmon waves to optical radiation. In their device, and most others in the literature, surface roughness is used to transform the confined surface plasmon wave in the MIM junction into radiation. This approach has the disadvantages that the optical power must traverse the thickness of the top metal layer before radiating into free space, which is a lossy process. Furthermore, for some applications, surface roughening is a rather uncontrolled method to couple out the light as the light will tend to radiate equally into the hemisphere above the device.

Several researchers also theorized the possibility of stimulated emission of surface plasmons in MIM diodes. For example, Siu et al. discuss the possibility of stimulated electron tunneling in a point contact MIM diode structure.[10] Siu et al. assert the existence of stimulated electron tunneling due to surface plasmon excitation in the point contact MIM structure as demonstrated in the negative differential resistance exhibited in theoretical calculations and in preliminary observations using high resistance, small area tungsten-on-gold point contact diodes. However, Siu et al. do not suggest practical applications for the phenomenon. As another example of theoretical research, Drury and Ishii discuss stimulated emission of surface plasmons in metal-insulator-metal diodes and suggest their use as coherent optical sources.[11, 12] Also, Aleksanyan et al. and Belenov et al. theorized on the amplification of surface plasmons in MIM junctions by stimulated emission.[8, 13, 14, 15] Aleksanyan et al. and Belenov et al. analyzed double- and triple-barrier structures, predicting near unity quantum efficiency in structures with two quantum wells (triple barrier) such that the plasmon-producing transition was due to the inelastic tunneling between quantum levels in these two wells. In one report, Belenov et al. discuss experimental results from a Au—$Al_2O_3$—$In_2O_3$—$Al_2O_3$—$In_2O_3$—$Al_2O_3$—Ag diode, showing a slight peak in the luminescence output corresponding to a peak in the current-voltage curve (a region of negative differential resistance).[15] They do not, however, show definitive amplification of surface plasmons. Xie also considers stimulated emission and absorption of surface plasmons in MIM transition metal type like junctions.[16] While Xie shows that stimulated emission of surface plasmons is theoretically possible in MIM devices, the material selection in the MIM diode as discussed in the article is very limited. Namely, the collector of the MIM diode in the article of Xie is required to be a transition metal, the insulator layer must be very thin (around 10 Å), and the stimulated emission only occurs at wavelengths longer than $\lambda \sim 10 \mu m$. Further, Xie restricts the outer metal layers of the MIM to single crystal metals. However, Xie does demonstrate the possibility of obtaining large gain from such devices and suggests that such a structure might be useful as an amplifier or emitter in the infrared region, although Xie does not discuss the possibility of gain in the visible or other spectra. Xie further suggests that the electron tunneling can be used as a pumping mechanism in plasmon devices with micro-dimensions, although he does not propose specific ways in which such devices might be implemented.

None of the above cited references discuss specific device structures, for example, for optical amplifiers or lasers, such as the configuration of input and output optical couplers or of resonant cavity design, but discuss only the electronic structure of the tunneling junction. Furthermore, none of the above references suggest methods for producing the necessary thin, uniform barrier and well layers for these devices.

Several researchers have proposed optical modulators based on the coupling of light with surface plasmon waves. In nearly all cases, reflected or waveguided light is attenuated by coupling into the surface plasmon mode, and this coupling is controlled by changing the index of refraction of a dielectric layer adjacent to the metal film. Thus, a fairly strong electro-optic effect is required ($\Delta n \sim 10^{-3} - 10^{-2}$) to operate the optical modulator. For example, Schildkraut proposed a reflection modulator in which light internally reflected within a prism can couple to a thin metal film on the backside of the prism by means of an electro-optic material adjacent to the metal film.[17] With an electro-optic material of second order susceptibility (e.g., $2 \times 10^{-7}$ esu), Schildkraut reports that a 100 volt signal modulates the optical reflectance from 0.00 to 0.84. As another example, Jannson et al. disclose a high-speed light modulator in U.S. Pat. No. 5,067,788, which includes a buffer and an electro-optic material sandwiched between two metal electrode layers, positioned adjacent to and separated from an optical waveguide (such as an optical fiber).[18] A surface plasmon wave is generated on the metal electrode adjacent to the optical waveguide by evanescent wave coupling. Applying a voltage across the electro-optic material changes the index of refraction of the material and thus the strength of the surface plasmon coupling. The optical intensity within the optical waveguide is therefore modulated in the device of Jannson.

As another example, in U.S. Pat. No. 6,034,809 Anemogiannis discloses an optical plasmon wave attenuator and modulator structures in which the output optical power is attenuated or modulated by controlling the amount of coupling between a guided optical signal and a separately generated surface plasmon wave.[19] Anemogiannis further considers the phase matching conditions for the coupling wave vectors to achieve efficient attenuation and modulation. Similarly, Janunts and Nerkararyan also proposed a modulator in which light is incident on a metal film through a prism coupled into a surface plasmon wave in the metal and which, in turn, radiates into an optical mode in a dielectric waveguide.[20] Coupling of the light into the waveguide is controlled by an electro-optic material on top of the metal film and dielectric waveguide. Again, large changes in index of refraction, Δn>0.001, are required to produce modulation.

All of the aforementioned modulators require the use of a suitable electro-optic material, such as a non-centrosymmetric crystal or nonlinear polymer. This requirement adds cost to device fabrication and limits device integration with other optoelectronic devices. In addition, these specialized materials generally require large voltages (10–100 V) to attain the necessary refractive index change for modulation.

The present invention provides surface plasmon devices which is intended to reduce or eliminate the foregoing problems in a highly advantageous and heretofore unseen way and which provides still further advantages.

References

[1] A. N. Korotkov, D. V. Averin and K. K. Likharev, "TASERs: Possible dc pumped terahertz lasers using interwell transitions in semiconductor heterostructures," Applied Physics Letters, Vol. 65, No. 15, pp. 1865–1867 (1994).

[2] H. Drexler, J. S. Scott, S. J. Allen, K. L. Campman and A. C. Gossard, "Photon-assisted tunneling in a resonant tunnelling diode: Stimulated emission and absorption in the THz range," Applied Physics Letters, Vol. 67, No. 19, pp. 4102–4104 (1995).

[3] K. Kempa, P. Bakshi, C. G. Du, G. Feng, A. Scorupsky, G. Strasser, C. Rauch, K. Uterrainer and E. Gornik, "Towards stimulated generation of coherent plasmons in nanostructures," Journal of Applied Physics, Vol. 85, No. 7, pp. 3708–3712 (1999).

[4] M. Asada, Y. Oguma and N. Sashinaka, "Estimation of interwell terahertz gain by photon-assisted tunneling measurement in triple-barrier resonant tunneling diodes," Applied Physics Letters, Vol. 77, No. 5, pp. 618–620 (2000).

[5] A. Tredicucci, C. Gmachi, M. C. Wanke, F. Capasso, A. Hutchinson, D. L. Sivco, S.-N. G. Chu and A. Y. Cho, "Surface plasmon quantum cascade lasers at λ~19 μm," Applied Physics Letters, Vo. 77, No. 15, pp. 2286–2288 (2000).

[6] J. J. Lambe and S. L. McCarthy, "Solid state source of radiant energy having a controllable frequency spectra characteristic," U.S. Pat. No. 4,163,920, issued Aug. 7, 1979.

[7] R. A. Volkov and A. F. Chuiko, "Tunneling-assisted photon emission in MIM junctions," Physica Status Solidi (b). J63, pp. 311–320 (1991).

[8] A. G. Aleksanyan, É. M. Belenov, I. A. Poluéktov, V. I. Romanenko, and A. V. Uskov, "Feasibility of developing a tunable oscillator utilizing a system of metal-barrier-metal-barrier-metal junctions," Soviet Journal of Quantum Electronics, Vol. 11, No.5, pp. 635–637(1981).

[9] É. M. Belenov, I. N. Kompanets, A. A. Krokhotkin, A. V. Lezhnev, I. A. Poluéktov, Yu. M. Popov, S. I. Sagitov, E. M. Soboleva, A. G. Sobolev, A. V. Uskov, and V. G. Tsukanov, "Investigation of the radiation emitted by metal-barrier-metal structures," Soviet Journal of Quantum Electronics, Vol. 13, No. 4, pp. 451–455 (1983).

[10] D. P. Siu, R. K. Jain, and T. K. Gustafson, "Stimulated electron tunneling in metal-barrier-metal structures due to surface plasmons," Applied Physics Letters, Vol. 28, No., 7, pp. 407–410 (1976).

[11] D. M. Drury and T. K. Ishii, "Theory of infrared and optical frequency amplification in metal-barrier-metal diodes," IEEE Transactions on Microwave Theory and Techniques, Vol. MTT-27, No. 6, pp. 598–603 (June 1979).

[12] D. M. Drury and T. K. Ishii, "A stimulated inelastic tunneling theory of negative differential resistance in metal-insulator-metal diodes," IEEE Journal of Quantum Electronics, Vol. QE-16, No. 1, pp. 58–69 (January 1980).

[13] É. M. Belenov, P. N. Luskinovich, V. I. Romanenko, A. G. Sobolev, and A. V. Uskov, "Resonant tunneling in multilayer structures in the presence of surface electromagnetic waves," Soviet Technical Physics Letters, Vol. 12, No. 4, pp. 200–202 (1986).

[14] É. M. Belenov, P. N. Luskinovich, V. I. Romanenko, A. G. Sobolev, and A. V. Uskov, "Emission of surface electromagnetic waves in the case of resonance tunneling of electrons," Soviet Journal of Quantum Electronics, Vol. 17, No. 10, pp. 1348–1352 (1987).

[15] É. M. Belenov, I. N. Kompanets, Yu. M. Popov, I. A. Poluéktov, S. I. Sagitov, E. M. Soboleva, A. G. Sobolev, A. V> Uskov, and V. G. Tsukanov, "Amplification of surface plasma oscillations in complex metal-barrier-metal structures," Soviet Journal of Quantum Electronics, Vol. 12, No. 7, pp. 930–931 (1982).

[16] L. Z. Xie, "Stimulated emission of surface plasmons in metal-insulator-metal (transition metal type like) structures," Infrared Physics, Vol. 25, No. 5, pp. 661–664 (1985).

[17] Jay S. Schildkraut, "Long-range surface plasmon electrooptic modulator," Applied Optics, Vol. 27, No. 21, pp. 4587–4590 (1988).

[18] T. P. Jannson, J. L. Jannson and B. Moslehi, "High modulation rate optical plasmon waveguide modulator," U.S. Pat. No. 5,067,788, issued Nov. 26, 1991.

[19] E. Anemogiannis, "Optical plasmon-wave structures," U.S. Pat. No. 6,034,809, issued Mar. 7, 2000.

[20] N. A. Janunts and Kh. V. Nerkararyan, "Modulation of light radiation during input into waveguide by resonance excitation of surface plasmons," Applied Physics Letters, Vol. 79, No. 3, pp. 299–301 (2001).

SUMMARY OF THE INVENTION

As will be described in more detail hereinafter, there is disclosed herein a device designed in accordance with one aspect of the present invention and including an input port, which input port is configured to receive an input signal, and an output port. The device also includes a structure, which structure in turn includes a tunneling junction connected with the input port and the output port. The tunneling junction is configured in a way (i) which provides electrons in a particular energy state within the structure, (ii) which produces surface plasmons in response to the input signal, (iii) which causes the structure to act as a waveguide for directing at least a portion of the surface plasmons along a predetermined path toward the output port such that the surface plasmons so directed interact with the electrons in a particular way, and (iv) which produces at the output port an output signal resulting from the particular interaction between the electrons and the surface plasmons.

In another aspect of the invention, an associated method of providing a device, as described above, is disclosed. The method includes the steps of providing an input port configured to receive an input signal and providing an output port. The method further includes the steps of providing a structure including a tunneling junction and connecting the tunnelling junction with the input port and the output port, the tunneling junction (i) providing electrons in a particular state within the structure, (ii) causing the structure to produce surface plasmons in response to the input signal, (iii) causing the structure to act as a waveguide for directing at least a portion of the surface plasmons along a predetermined path toward the output port such that the surface plasmons so directed interact with the electrons in a particular way, and (iv) producing at the output port an output signal resulting from and in response to the particular interaction between the electrons and the surface plasmons.

In still another aspect of the invention, a detector for detecting input electromagnetic radiation incident thereon is disclosed. The detector includes an input port, which input port is configured to receive the input electromagnetic radiation, and an output port. The detector of the present invention further includes a structure, which structure in turn includes a tunneling junction connected with the input port and the output port. The tunneling junction is configured in a way (i) which provides electrons in a particular energy state within the structure, (ii) which produces surface plasmons in response to the input electromagnetic radiation, (iii) which causes the structure to act as a waveguide for directing at least a portion of the surface plasmons along a predetermined path toward the output port such that the surface plasmons so directed interact with the electrons in a particular way, and (iv) which produces at the output port an output electrical signal resulting from the particular interaction between the electrons and the surface plasmons.

In yet another aspect of the invention, an amplifier for amplifying input electromagnetic radiation incident thereon is disclosed. The amplifier includes an input port, which input port is configured to receive the input electromagnetic radiation, and an output port. The amplifier further includes a structure, which structure in turn includes a tunneling junction connected with the input port and the output port. The tunneling junction is configured in a way (i) which provides electrons in a particular energy state within the structure, (ii) which produces surface plasmons in response to the input electromagnetic radiation, (iii) which causes the structure to act as a waveguide for directing at least a portion of the surface plasmons along a predetermined path toward the output port such that the surface plasmons so directed interact with the electrons in a particular way, and (iv) which produces an output electromagnetic radiation with a given gain at the output port, the output electromagnetic radiation resulting from the particular interaction between the electrons and the surface plasmons.

In a still further aspect of the invention, an emitter is disclosed. The emitter of the present invention includes an input port, which input port is configured to receive an input electrical current, and an output port. The emitter further includes a structure, which structure in turn includes a tunneling junction connected with the input port and the output port. The tunneling junction includes first and second non-insulating layers and an arrangement disposed between the first and second non-insulating layers. The arrangement is configured to serve as a transport of electrons between the first and second non-insulating layers and includes at least two insulating layers. The tunneling junction is configured in a way (i) which causes the electrons to be in a particular energy state within the structure, (ii) which produces surface plasmons in response to the input electrical current, (iii) which causes the structure to act as a waveguide for directing at least a portion of the surface plasmons along a predetermined path toward the output port, and (iv) which produces at the output port an output electromagnetic radiation resulting from the particular interaction between the electrons and the surface plasmons.

In another aspect of the invention, a laser is disclosed. The laser of the present invention includes an input port, which input port is configured to receive an input electrical current, and an output port. The laser further includes a structure, which structure in turn includes a tunneling junction connected with the input port and the output port. The tunneling junction is configured in a way (i) which provides electrons in a particular energy state within the structure and (ii) which produces surface plasmons in response to the input electrical current. Still further, the laser includes a reflective assembly configured to form a resonant cavity surrounding the structure. The reflective assembly is configured for selectively confining at least a portion of the surface plasmons within the resonant cavity while selectively directing another portion of the surface plasmons along a predetermined path toward the output port such that the surface plasmons so confined interact with the electrons in a particular way so as to produce an output electromagnetic radiation, which output electromagnetic radiation results from the particular interaction between the electrons and the portion of surface plasmons confined within the resonant cavity.

In yet another aspect of the invention, a modulator is disclosed. The modulator of the present invention includes an input port, which input port is configured to receive an input electromagnetic radiation, and an output port. The modulator further includes a signal source for providing a modulation signal. Still further, the modulator includes a structure, which structure in turn includes a tunneling junction connected with the input port and the output port. The tunneling junction is configured for receiving the modulation signal from the signal source. The tunneling junction is further configured in a way (i) which provides electrons in a particular energy state within the structure responsive to and as a function of the modulation signal, (ii) which produces surface plasmons in response to the input electromagnetic radiation, (iii) which causes the structure to act as a waveguide for directing at least a portion of the surface plasmons along a predetermined path toward the output port such that the surface plasmons so directed interact with the electrons in a particular way, and (iv) which produces at the output port an output electromagnetic radiation resulting from the particular interaction between the electrons and the surface plasmons such that the output electromagnetic radiation displays at least one characteristic that is a function of the modulation signal.

In a yet further aspect of the invention, a filter is disclosed. The filter of the present invention includes an input port, which input port is configured to receive an input electromagnetic radiation over a range of frequencies, and an output port. The filter further includes a structure including an insulating layer and a non-insulating layer disposed adjacent to the insulating layer such that an interface is defined between the insulating and non-insulating layers. The insulating and non-insulating layers are connected with the input port and the port, and are configured in a way which produces surface plasmons in response to the input electromagnetic radiation at the interface between the insulating and the non-insulating layers. Still further, the filter includes a reflective assembly configured to form a resonant cavity surrounding the structure. The reflective assembly is configured for selectively confining at least a portion of the surface plasmons within the resonant cavity while selectively directing another portion of the surface plasmons along a predetermined path toward the output port so as to produce an output electromagnetic radiation having predetermined frequencies selected from within the range of frequencies.

In a still further aspect of the invention, a polarization rotator is disclosed. The polarization rotator of the present invention includes an input port, which input port is configured to receive an input electromagnetic radiation having a first polarization state, and an output port. The polarization rotator further includes a main body connected with the input port and the output port. The main body includes a waveguide structure and a non-insulator arrangement at least partially surrounding the waveguide structure. The main body is configured for producing surface plasmons having the first polarization state in response to the input electromagnetic radiation. The waveguide structure and the non-insulator arrangement are configured for directing at least a portion of the surface plasmons along a predetermined path toward the output port in a way which produces at the output port an output electromagnetic radiation having a second polarization state.

DESCRIPTION OF THE DRAWINGS

The present invention may be understood by reference to the following detailed description taken in conjunction with the drawings briefly described below.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

Although the aforedescribed prior art devices and theoretical disclosures regarding sophisticated manipulation of surface plasmons, such as stimulated emission and stimulated absorption, have been made over the past twenty-five years, the Applicants are unaware of presently available, practical devices that actually allow such manipulations. Recent progress in tunneling junction technology by the assignee of the present application has greatly increased the flexibility in fabrication and design of electron tunneling devices based on metal-insulator(s)-metal structures, thus allowing the fabrication of high speed electron tunneling devices (See, copending U.S. patent application Ser. No. 09/860,988 and copending U.S. patent application Ser. No. 09/860,972, both of which applications are incorporated herein by reference). However, the aforementioned prior art devices as well as the devices of the copending U.S. patent applications Ser. Nos. 09/860,988 and 09/860,972 are based on small area tunneling junctions (i.e., the tunneling junction region is on the order of square microns or less in area) and therefore tend to be RC-limited, and these lumped small area devices do not provide a waveguide path to guide the propagation of surface plasmons through the devices. For example, although the device of Lambe et al. provides broadband emission from a tunneling junction structure, the surface plasmon propagation is limited to random emission through the top metal layer, which has been etched so as to be slightly porous. Therefore, it would be desirable to provide a predetermined waveguide path along which surface plasmons can be directed toward, for example, an output port or a separate functional unit (detector, modulator, amplifier, etc.), and, optionally, to provide a particular path along which an arrangement may be provided to tune the operation of the device.

Figure 1A:
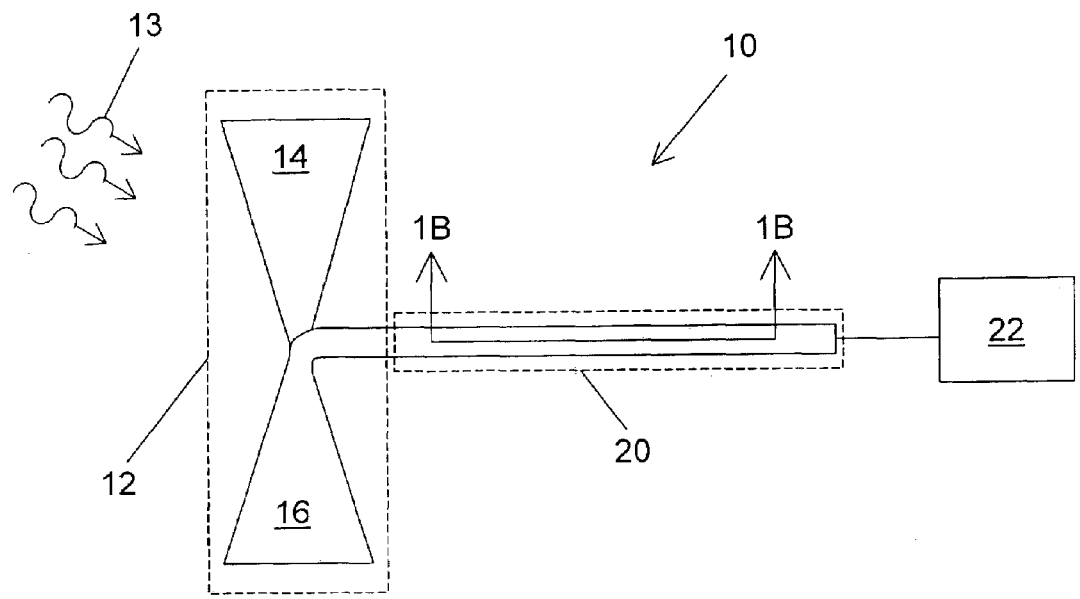
FIG. 1A is a diagrammatic illustration of a top view of a detector including a traveling wave detection region designed in accordance with the present invention, shown here to illustrate an implementation including an input antenna configuration.

Turning now to the drawings, wherein like components are indicated by like reference numbers throughout the various figures, attention is immediately directed to FIGS. 1A–1D. In FIG. 1A, a detector 10 designed in accordance with the present invention is illustrated. Detector 10 includes an input antenna (enclosed by dashed lines 12), which is designed to receive input electromagnetic radiation 13 incident thereon. Input antenna 12 is formed of a first metal layer 14 and a second metal layer 16. Input antenna 12 is configured to convert the received input electromagnetic radiation into surface plasmons (not shown) and to direct them by waveguide action toward a detection region (enclosed by dashed lines 20), which is integrally formed from first metal layer 14 and second metal layer 16. Detection region 20 is configured to absorb the surface plasmons via rectification and, consequently, generate an output electrical signal which is directed to an output 22. Output 22 may be, for example, an ammeter or oscilloscope for measuring and viewing the output electrical signal.

Figure 1B:
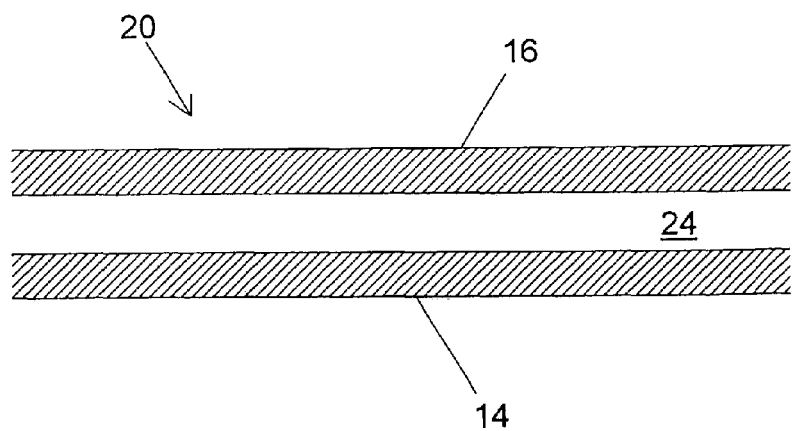
FIG. 1B is a diagrammatic illustration in partial cross section of the detector of FIG. 1A, shown here to illustrate the layered structure of the traveling wave detection region of the detector.

The details of detection region 20 are illustrated in FIG. 1B, which shows a cross-sectional view of a portion of detector 10 of FIG. 1A. As can be seen in FIG. 1B, detection region 20 is formed of first metal layer 14 and second metal layer 16 with an insulating arrangement 24 disposed therebetween so as to define a tunneling junction structure while providing a waveguide for the surface plasmons generated by the input antenna. For purposes of the present application, a tunneling junction structure is understood to be a structure including two outer layers of non-insulative material(s) spaced apart such that an insulative arrangement, such as one more layers of a dielectric material, is positioned therebetween. Examples of such tunneling junction structures are disclosed in the aforementioned co-assigned and copending U.S. patent application Ser. No. 09/860,988 and Ser. No. 09/860,972, both of which are incorporated herein by reference. In particular, in one embodiment of the present invention, first metal layer 14 is formed of a 40 nm thick layer of niobium deposited by sputtering. Insulating arrangement 24 may be a native oxide of first metal layer 14 and a second oxide layer, such as tantalum oxide, deposited by atomic layer deposition (ALD) or formed by sputtering. Alternatively, both insulator layers may be deposited by ALD or formed by sputtering. Second metal layer 16 in this embodiment can be a 40 nm thick layer of tantalum deposited by sputtering methods.

Continuing to refer to FIG. 1B, the first metal layer 14, insulating arrangement 24 and second metal layer 16 are of predetermined widths to enable guiding of surface plasmons received from the input antenna toward the output. When the surface plasmons, generated by the input antenna in response to the input electromagnetic radiation, reach detection region 20, some of the surface plasmons are absorbed with a given absorption coefficient by electrons present in the detection region such that at least some of the electrons are caused to tunnel between first and second metal layers 14 and 16. The tunneling electrons result in the generation of an electrical current between first and second metal layers 14 and 16, which electrical current is directed toward the output. In other words, the surface plasmons interact with tunneling electrons in the detection region such that rectification of the energy of the surface plasmons in detection region 20 results in the generation of the output electrical signal. Particularly, the output electrical signal is produced by surface plasmon-induced electron tunneling through the detection region.

Still referring to FIGS. 1A and 1B, the elongated configuration of detection region 20 serves to guide the surface plasmons as a traveling, slow mode surface plasmon wave so as to eliminate the time constant limitation concerns of the aforementioned lumped small area devices. Since the slow-mode surface plasmon wave propagates along the tunneling junction, as opposed to perpendicularly through the tunneling junction as in the case of the lumped small area devices, elongated, detection region 20 does not have the same limitations on the RC time constant as the lumped small area devices. Lumped small area devices operate by creating a uniform oscillating field across the tunneling junction, and therefore RC limitations apply. In the traveling wave devices, however, the oscillating field across the tunneling junction also propagates along the tunneling junction, hence RC time constant is not a limitation and essentially only affects the propagation velocity of the traveling surface plasmon wave. In addition, the configuration of detection region 20 makes impedance matching of detection region 20 to input antenna 12 easier than in small area devices. In a lumped small area device, the impedance of the optical antenna element must be matched to the RC equivalent circuit impedance of the tunneling junction, which can be thousands or millions of ohms for tunneling junctions with areas of $10^{-10}$ cm$^2$. This impedance matching consideration can pose difficulties for the antenna designer. In the traveling wave detector, by comparison, the waveguide impedance for the slow mode surface plasmon is on the order of 40–50 ohms (for example, for 0.8 eV light), which impedance value is much easier to match with an antenna or optical coupler. Furthermore, the impedance of the lumped small area devices varies exponentially with the thickness of the insulating layer, and hence impedance matching to a specific antenna impedance is difficult. The traveling wave devices have a characteristic impedance that is much less dependent on the thickness of the insulating layer, therefore the processing window that provides for good matching to the antenna is much wider, thus increasing fabrication yield. Therefore, the width of detection region 20 should be designed so as to efficiently guide the surface plasmon waves through the device toward the output along a predetermined path.

Figure 1C:
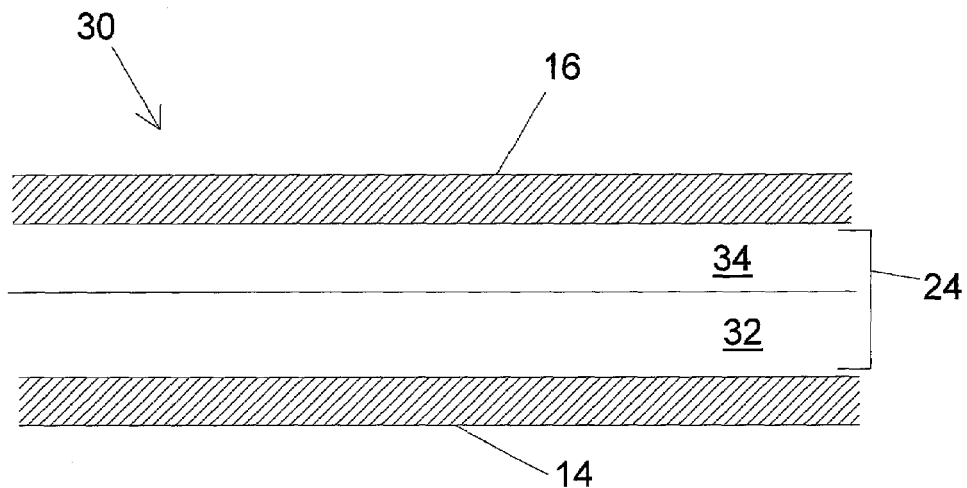
FIG. 1C is a diagrammatic illustration in partial cross section of an alternative configuration of the detector of FIG. 1A, shown here to illustrate an alternative layered structure of the traveling wave detection region of the detector.
Figure 1D:
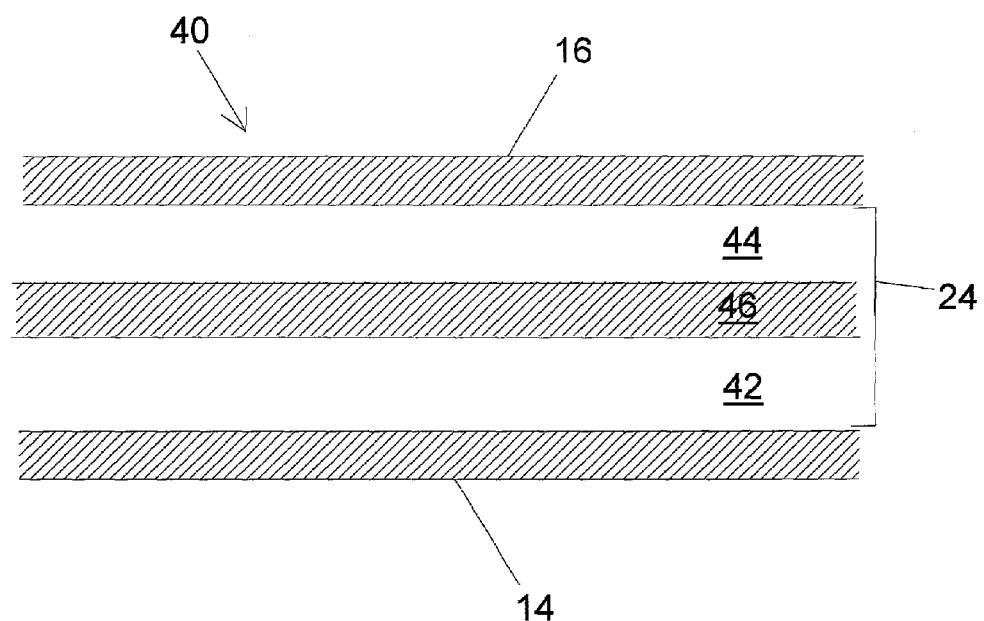
FIG. 1D is a diagrammatic illustration in partial cross section of another alternative configuration of the detector of FIG. 1A, shown here to illustrate another alternative layered structure of the traveling wave detection region of the detector.

Referring now to FIGS. 1C and 1D in conjunction with FIGS. 1A and 1B, the design of detection region 20 can be optimized, for example, for low-pass filtering by making the waveguide area large, which increases the RC time constant and lowers the maximum signal bandwidth detectable (while the optical carrier frequency response remains high). Such a solution would help minimize noise in detectors designed to operate at low signal frequencies. Furthermore, different layer designs are possible to tailor the electron tunneling characteristics through the tunneling junction. For example, insulating arrangement 24 can include a single dielectric layer, multiple dielectric layers, a combination of dielectric and metal layers, semiconductors and/or superconductors. For instance, as shown in FIG. 1C, insulating arrangement 24 can include first and second dielectric layers 32 and 34 positioned adjacent to each other to enhance the nonlinearity of the electron tunneling process therethrough, as disclosed in detail in the aforementioned co-assigned and copending U.S. patent applications. Also, as shown in FIG. 1D, insulating arrangement 24 can include first and second dielectric layers 42 and 44 as well as a third metal or insulator quantum well layer 46 to form a double-barrier resonant tunneling diode.

Figure 2A:
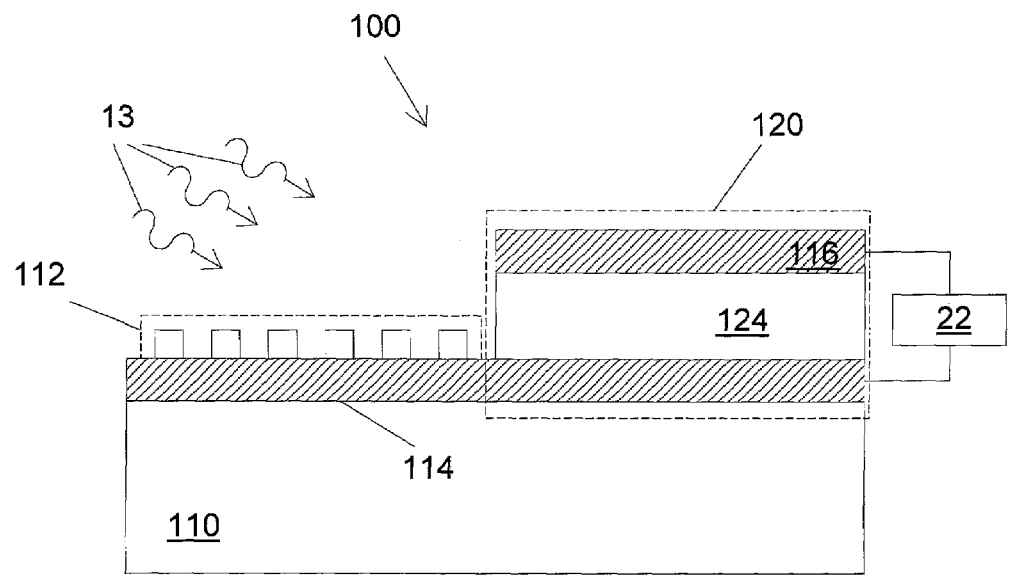
FIG. 2A is a diagrammatic illustration of a side view of still another alternative configuration for the detector designed in accordance with the present invention, shown here to illustrate an alternative input coupler including a grating.
Figure 2B:
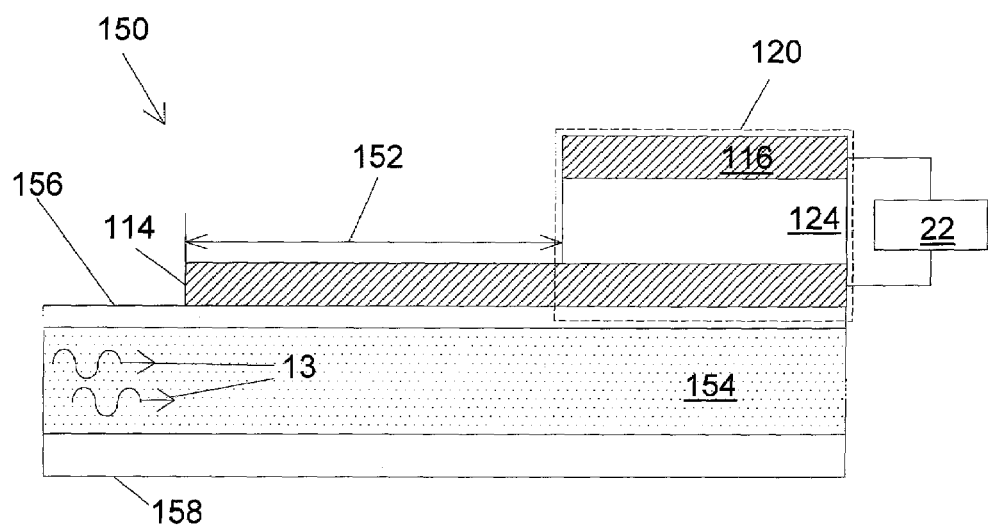
FIG. 2B is a diagrammatic illustration of a side view of yet another alternative configuration for the detector designed in accordance with the present invention, shown here to illustrate another alternative input coupler including an evanescent wave coupler.

Although input antenna 12 is shown as bowtie antenna in FIG. 1A, other antenna and input coupler designs are possible as long as proper impedance matching is achieved between the input coupler and the detection region. In FIGS. 2A and 2B, two alternative input coupler configurations are shown. FIG. 2A illustrates an embodiment of a detector 100 formed on a substrate 110. Detector 100 includes an input grating coupler (enclosed by dashed lines 112) formed on top of a first metal layer 114. A detection region (enclosed by dashed lines 120) is formed by first metal layer 114 and a second metal layer 116 with an insulating arrangement 124 disposed therebetween. Insulating arrangement 124 can be, for example, one of the layer configurations illustrated in FIGS. 1B–1D. Detector 100 receives input TM-polarized electromagnetic radiation 13 at input grating coupler 112, which then converts the received input electromagnetic radiation into surface plasmons and directs the surface plasmons into detection region 120.

Alternatively, in FIG. 2B, a detector 150 including an input evanescent wave coupling region 152 is shown. Electromagnetic waveguide region is separated from first metal layer 114 by a barrier layer 156 and also formed on a substrate 158. Detector 150 is configured to receive input electromagnetic radiation 13 via an electromagnetic waveguide region 154. The input TM-polarized electromagnetic radiation is coupled into the device as a surface plasmon wave and directed into detection region 120 to be rectified in the manner described above. First metal layer 114 and barrier layer 156 should be thin enough such that the input electromagnetic radiation can be coupled into detection region 120 as a surface plasmon wave. Surface plasmon penetration depth into metals is on the order of 20–30 nm for infrared radiation so that metal layer 114 should be 20–30 nm or slightly thinner to maximize field penetration.

In addition, it is known that tunneling junctions, such as in the elongated waveguide structure of the detector of the present invention, including two outer metal layers with an insulating arrangement (whether a single insulating layer or multiple layers combining and insulating and non-insulating layers) generally supports three fundamental surface plasmon traveling wave modes: the aforedescribed slow mode, which interacts strongly with tunneling electrons but has a relative short propagation length due to high loss, and two fast modes, which do not interact so strongly with tunneling electrons and have relatively long propagation lengths. It is possible to minimize slow mode surface plasmon wave reflections between the input coupler and the detection region by adding a quarterwave antireflection layer between these two portions of the detector such that strong interaction with tunneling electrons is maintained in the detector. A key aspect of the antireflection layer is that its insulator thickness is chosen to null out back-reflections between the layers of thick insulator and very thin, tunnel insulator.

Figure 2C:
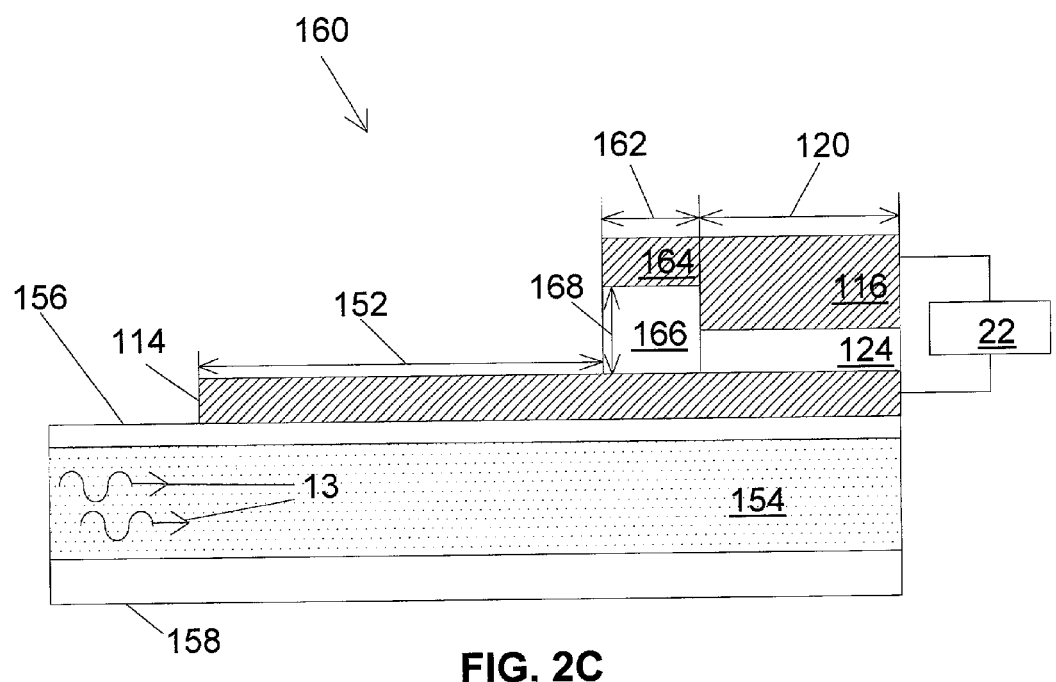
FIG. 2C is a diagrammatic illustration of a side view of a further alternative configuration for the detector designed in accordance with the present invention, shown here to illustrate an output coupler configuration including an antireflection arrangement.

As an example, FIG. 2C illustrates a detector 160, which is a modification of detector 150 of FIG. 2B and includes an antireflection arrangement, indicated by double-headed arrow 162. Antireflection arrangement 162 is disposed between detection region 120 and input evanescent wave coupling region 152. Antireflection arrangement 162 includes an additional metal layer 164 and an additional insulator layer 166. The thickness of additional insulator layer 166, indicated by double-headed arrow 168, is such that the slow mode surface plasmon propagation constant in that region is equal to the geometric mean of the propagation constants in the two surrounding regions. The width of antireflection arrangement 162, corresponding to the length of double-headed arrow 162, is chosen to be a quarter wave of the electromagnetic radiation wavelength for which detector 160 is designed.

Figure 3A:
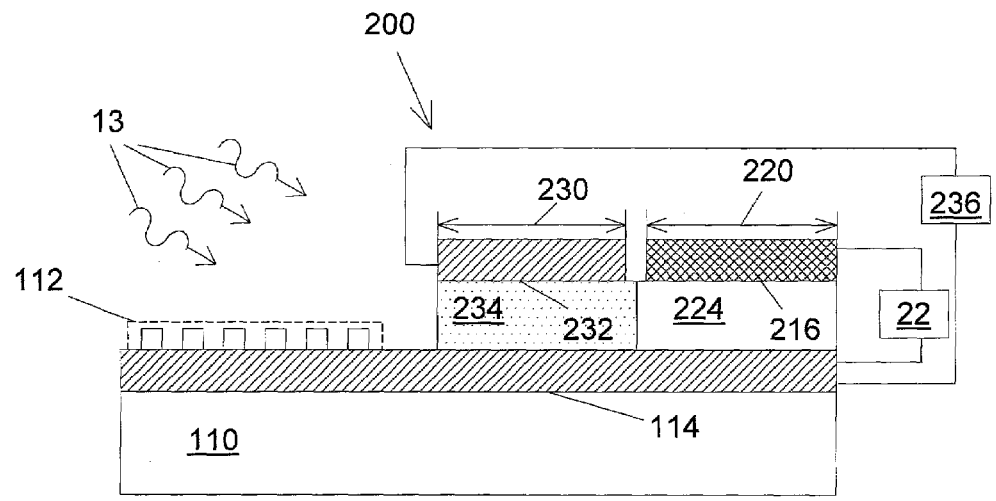
FIG. 3A is a diagrammatic illustration of a side view of a detector including a gain region designed in accordance with the present invention.

FIG. 3A illustrates yet another embodiment of a detector 200 designed in accordance with the present invention. Detector 200 is similar to detector 100 of FIG. 2A and includes input grating coupler 112. Like detector 100 of FIG. 2A, detector 200 includes first metal layer 114 deposited along the top of substrate 110. However, detector 200 includes a second metal layer 216 and a first insulating arrangement 224 forming a detection region (indicated by a double headed arrow 220), which detection region 220 is separated from input grating coupler 112 by a gain region (indicated by another double headed arrow 230). Gain region 230 is also a tunneling junction structure formed of a third metal layer 232 and a second insulating arrangement 234. While detection region 220, like detection region 20 of FIG. 1A, is designed for rectification of surface plasmons to provide an output electrical signal at output 22, gain region 230 serves as a plasmon wave "preamplifier" to provide additional surface plasmons by a process of stimulated emission. That is, gain region 230 is configured such that, when it receives the surface plasmons generated by input grating coupler 112, the surface plasmons so received cause plasmon-induced electron tunneling in the gain region. Unlike detection region 220, gain region 230 is further configured such that the tunneling electrons give up their energies to stimulate the emission of additional plasmons in the gain region. All of the surface plasmons are then directed into the detection region for rectification and subsequent generation of the output electrical signal.

Figure 3B:
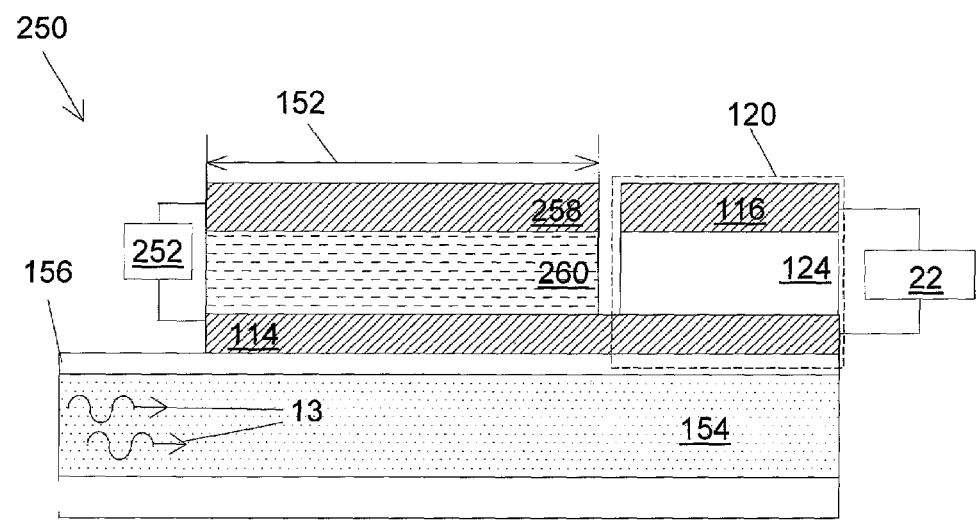
FIG. 3B is a diagrammatic illustration of a side view of still another alternative configuration of the detector designed in accordance with the present invention, shown here to illustrate the details of a tuning arrangement.

Still further, detector 150 of FIG. 2B can be made into a tunable device. As shown in FIG. 3B, an electrical arrangement 252 is provided to supply an electrical voltage between first metal layer 114 and electrode 258, thus across an electrooptic material 260 positioned adjacent to the metal layer of the plasmon coupling region 152. Varying the voltage provided by electrical arrangement 252 changes the coupling condition from the dielectric waveguide 154 into the metal layer 114 and thereby shifts the optical frequency which will couple into the detector. As in detector 150, detection region 120 includes insulating arrangement 124 disposed between first and second metal layers 114 and 116 such that detection region 120 forms a tunneling junction structure for rectification of surface plasmons directed therein.

Figure 4A:
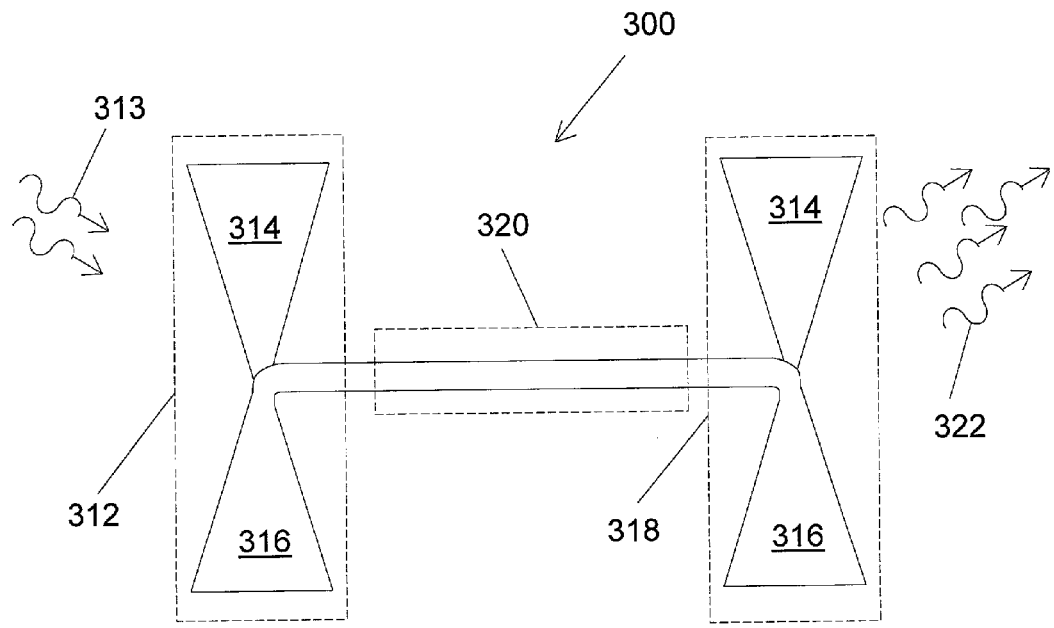
FIG. 4A is a diagrammatic illustration of a top view of an amplifier including a traveling wave gain region designed in accordance with the present invention, shown here to illustrate an implementation including an input antenna and an output antenna.
Figure 4B:
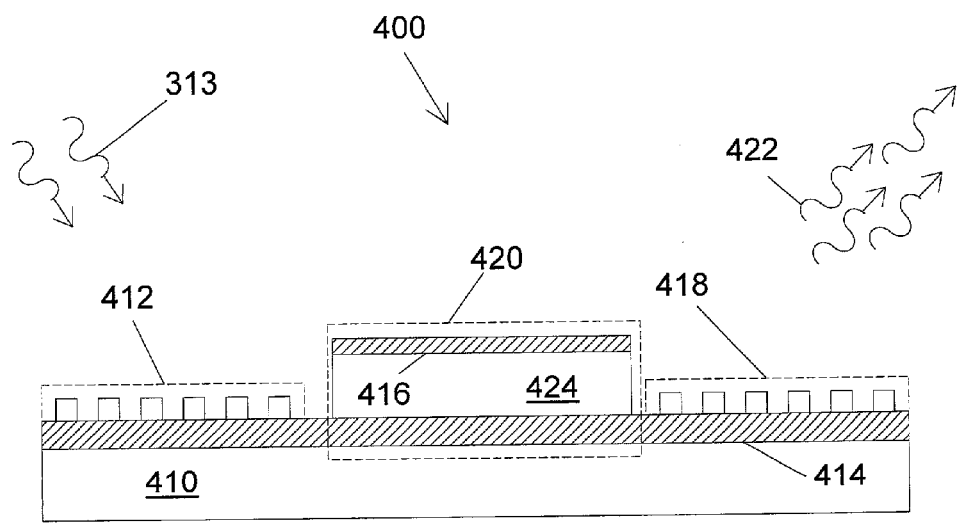
FIG. 4B is a diagrammatic illustration of a side view of an alternative configuration for the amplifier designed in accordance with the present invention, shown here to illustrate alternative input and output couplers including gratings.
Figure 4C:
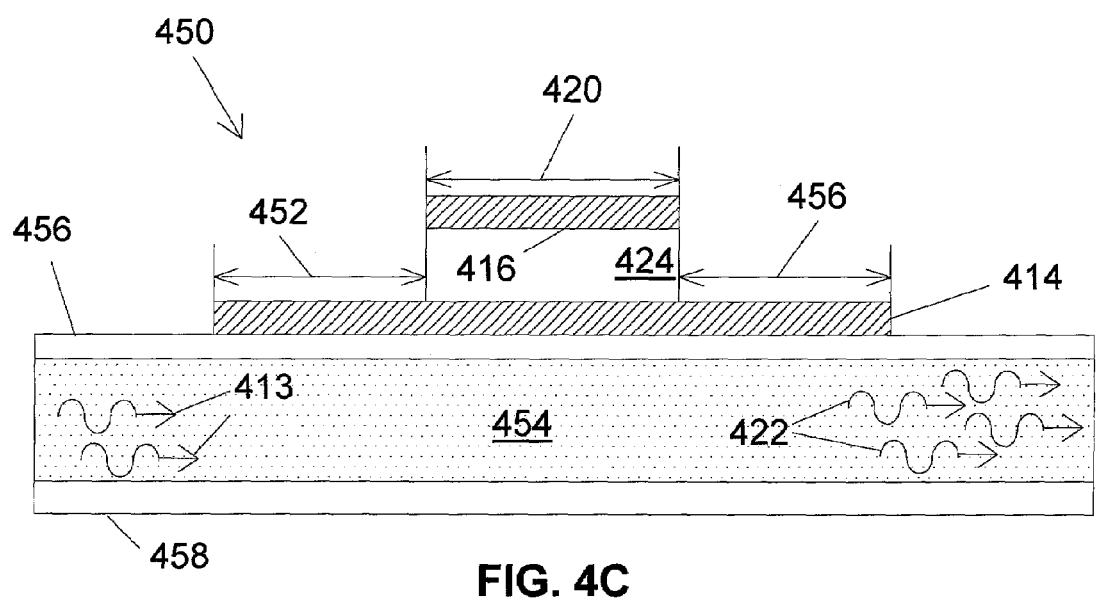
FIG. 4C is a diagrammatic illustration of a side view of another alternative configuration for the amplifier designed in accordance with the present invention, shown here to illustrate alternative input and output couplers including evanescent wave couplers.

Turning now to FIGS. 4A–4C, an amplifier designed in accordance with the present invention is described. FIG. 4A illustrates an amplifier 300 including an input antenna (enclosed by dashed lines 312), which input antenna is configured to receive input electromagnetic radiation 313. Input antenna 312 is formed of a combination of one end of a first metal layer 314 and one end of a second metal layer 316. The opposing ends of first metal layer 314 and second metal layer 316 form an output antenna (enclosed by dashed lines 318). First and second metal layers 314 and 316 further serve to define a gain region (enclosed by another set of dashed lines 320) between input antenna 312 and output antenna 318. Gain region 320 can include, for example, an insulator arrangement (such as multiple dielectric layers, quantum dots, etc., not shown) as described in the foregoing discussion of the detector of the present invention such that gain region 320 serves as a tunneling junction structure. Amplifier 300 is configured such that input antenna 312 receives input electromagnetic radiation 313. Input antenna 312 then converts the received input electromagnetic energy into surface plasmons and directs the surface plasmons toward gain region 320. As described above with regard to gain region 230 shown in FIG. 3A, gain region 320 of amplifier 300 is designed such that the surface plasmons from input antenna 312 cause electrons to tunnel between first and second metal layers 314 and 316, thereby producing additional surface plasmons by stimulated emission. Then, the additional surface plasmons are directed into output antenna 318, which in turn converts at least a portion of the surface plasmons directed therein into output electromagnetic radiation 322.

Gain region 320 is configured to maximize the stimulated emission process so as to provide maximum gain while minimizing loss. For example, by proper design of the layers of the tunneling junction structure, the efficiency of the stimulated emission process can be enhanced. By appropriate tunneling junction design, the probability of stimulated emission exceeds the probability of stimulated absorption in order to help minimize surface plasmon loss during propagation through the gain region. For instance, gain region 320 can include a layered structure such as, but not limited to, one or more dielectric layers, one or more additional metal layers and/or a discontinuous layer, such as a layer of quantum dots. As an example, gain region 320 can include a triple-barrier (i.e., two quantum well) tunneling structure in which the stimulated emission transition occurs between quantum levels in the two well regions. Alternatively, the quantum levels could also be realized, for example, by forming isolated metal quantum dots by incomplete coalescence of a thin metal layer. The resonant tunneling through these quantum well and quantum dot structures yields highly nonlinear current-voltage response, such as negative differential resistance, and, subsequently, high stimulated emission efficiency.

The amplifier of the present invention is particularly advantageous in that the device is not RC limited due to the traveling wave design. Therefore, the tunneling junction can be made larger than in point contact devices, thus improving manufacturing tolerances and reducing the device susceptibility to thermal damage and static or transient charge damage. While these traveling wave devices are larger than point contact tunnel junction devices, they are considerably smaller than equivalent optoelectronic devices built on dielectric waveguides, such as semiconductor optical amplifiers. This compactness is due to the strong guiding nature of surface plasmons compared to optical waves in dielectric waveguides. As a result, while a single mode dielectric waveguide may have cross sectional dimensions of several microns or even tens of microns, a slow mode surface plasmon waveguide may have cross sectional dimensions of only a hundred to a thousand nanometers. This device compactness is a great advantage particularly for integrated optics applications.

Other loss minimization considerations can also be made. As mentioned above with respect to detectors, tunneling junctions generally support one slow mode and two fast modes of surface plasmon traveling waves. Therefore, the gain region can be designed to maximize the propagation efficiency of the slow mode surface plasmons in order to maximize the gain while minimizing loss. For example, the tunneling junction thickness can be optimized. It is known that thicker junctions have lower tunneling current, and hence, lower gain per unit length; however thicker tunneling junctions also have lower slow mode surface plasmon wave propagation loss since more of the optical field drops across the insulator and not the metal layers. Therefore, the tunneling junction thickness can be optimized to balance the gain per length and slow mode surface plasmon wave propagation loss. Moreover, since slow mode surface plasmon propagation loss is predominantly due to conductive loss in the metal layers, the selection of highly reflective metals, such as the noble metals gold (Au), silver (Ag), aluminum (Al) and copper (Cu), can minimize the propagation loss. Other metals, such as niobium (Nb) and tantalum (Ta), may also be good choices because their reflectivity values are reasonably high in the infrared and their native oxides so as to result in low barrier height and therefore low resistance tunneling junctions. Also, as discussed in relation to the aforedescribed devices of the present invention, an antireflection layer can be incorporated into the amplifier between the input antenna and the gain region and/or between the gain region and the output antenna to reduce coupling loss between the antennae and the gain region.

Minimization of loss in the device can also lead to a reduction in the noise level of the device. Decreased loss would lead to lower gain thresholds, which lowers the probability of spontaneous emission of surface plasmons in the device. As a result, the noise level in the amplifier would be lowered.

As in the case of the aforedescribed detector, other input/output coupler designs are possible for use with the amplifier of the present invention. For example, FIG. 4B illustrates an amplifier 400 including an input grating coupler 412 and an output grating coupler 418 in place of the input and output antennae shown in FIG. 4A. Also, in FIG. 4C, an amplifier 450 including an input evanescent wave coupling region (indicated by a double headed arrow 452) and an output evanescent wave coupling region (indicated by another double headed arrow 456) in place of input and output antennae 312 and 318 of FIG. 4A is shown.

Furthermore, an active feedback mechanism (not shown) can be added to the amplifier of the present invention. Due to the sensitivity of surface plasmons to small changes in properties of the metal-dielectric interface, small temperature perturbations can cause relatively large fluctuations in the surface plasmon wavelength. This effect can be problematic, for example, for resonant structures such as laser cavities. An active feedback mechanism, such as a voltage-controlled electro-optic layer beside the insulating layer, can be used to compensate for such temperature fluctuations. The feedback arrangement can be configured to monitor the output of the amplifier and, if the output signal is reduced by a certain amount, to apply the appropriate tuning voltage across tunneling region such that the amplifier provides a substantially constant gain. For example, digital signal restoration can be provided as follows. By limiting the rate at which charge is supplied to the electrodes of the gain medium, the gain will saturate at a particular surface plasmon amplitude. One way to accomplish this is to supply current to 416 through a resistor, such that when the surface plasmons draw a current above a predetermined level, then the voltage applied to the electrodes drops below the level required to provide additional gain.

Attention is now directed to FIGS. 5A–5D, illustrating embodiments of an emitter designed in accordance with the present invention. First considering FIG. 5A, an emitter 500 includes an input current source 510 and an output antenna (enclosed in dashed lines 512). Output antenna 512 is formed of a first metal layer 514 and a second metal layer 516. First metal layer 514 and second metal layer 516 are extended to integrally form a surface plasmon waveguide section (indicated by another set of dashed lines 520). Surface plasmon waveguide section 520 is configured to receive an input current from input current source 510 such that the input current is applied across first metal layer 514 and second metal layer 516. The input current causes electrons to tunnel between the first and second metal layers so as to generate surface plasmons in surface plasmon waveguide section 520 by spontaneous emission of incoherent surface plasmons. In other words, the input current imparts energy to at least some of the electrons in the surface plasmon waveguide section. Then, the energized electrons spontaneously lose their energy and, consequently, spontaneously emit surface plasmons. Surface plasmon waveguide section 520 is further configured to direct the surface plasmons so generated toward output antenna 512 to be coupled out as broadband, incoherent, output electromagnetic radiation 522. In essence, emitter 500 works like a light emitting diode (LED) by using an electrical current as an input to generate a broadband, incoherent electromagnetic output by spontaneous emission. That is, emitter 500 takes electrical current as the input and generates a broadband electromagnetic radiation as the output, which is a function of the input.

Figure 5A:
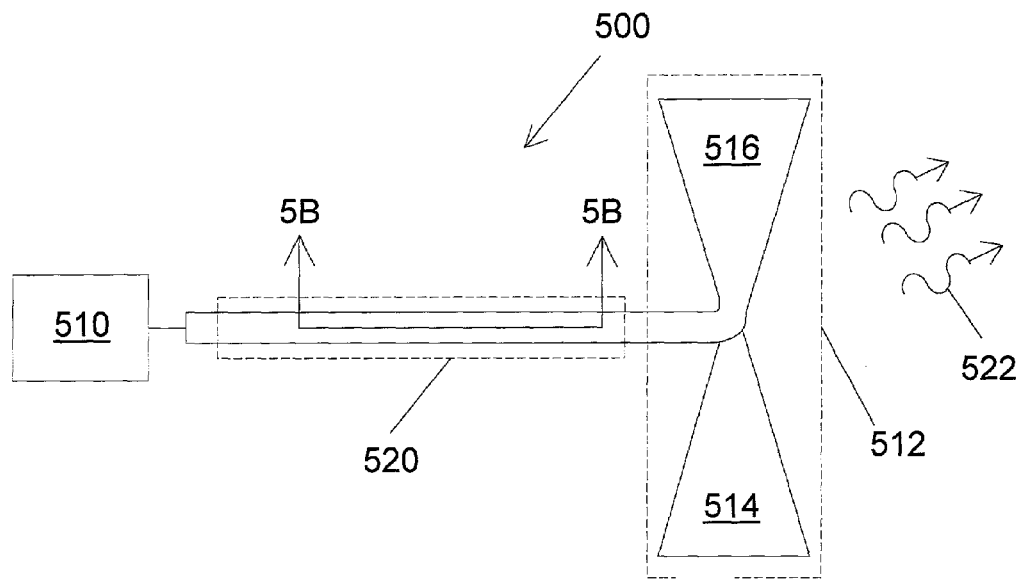
FIG. 5A is a diagrammatic illustration of a top view of an emitter including a tunneling/plasmon waveguide region designed in accordance with the present invention, shown here to illustrate an implementation including an output antenna configuration.
Figure 5B:
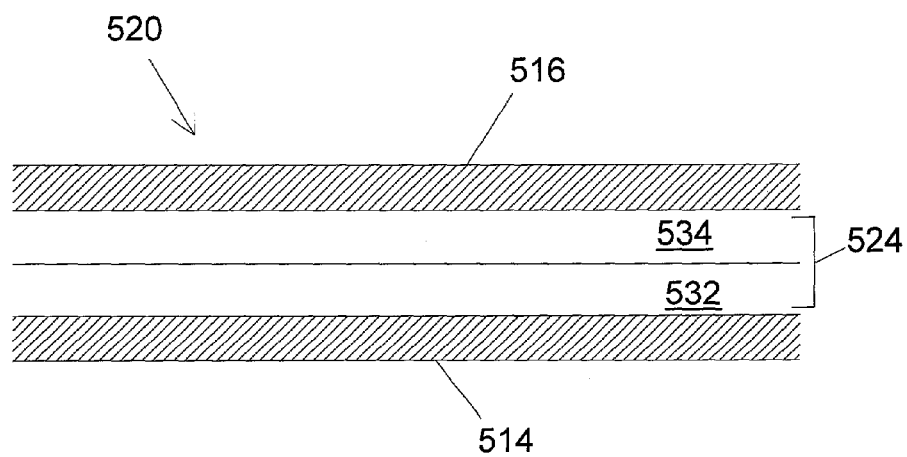
FIG. 5B is a diagrammatic illustration in partial cross section of the emitter of FIG. 5A, shown here to illustrate the layered structure of the traveling wave detection region of the detector.

FIG. 5B shows a cross sectional view of surface plasmon waveguide section 520 of FIG. 5A. Surface plasmon waveguide section 520 includes an insulating arrangement 524 positioned between first metal layer 514 and second metal layer 516. In the embodiment shown in FIG. 5B, insulating arrangement 524 in turn includes a first dielectric layer 532 directly adjacent to a second dielectric layer 534. Alternatively, insulating arrangement 524 can further include additional components such as, but not limited to, one or more additional metal layers, one or more additional dielectric layers and/or a discontinuous layer, such as a layer of quantum dots (not shown). The layered structure design of surface plasmon waveguide section 520 should be configured to maximize the spontaneous emission of surface plasmons within the surface plasmon waveguide section. For example, double-barrier (one quantum well) and triple-barrier (two quantum well) structures can increase the spontaneous emission probability over single barrier designs by increasing the probability of inelastic tunneling and reducing the probability of elastic tunneling. In addition, to further enhance the coupling of the generated surface plasmons out of output antenna 512, an antireflection layer as described above can be positioned between surface plasmon waveguide section 520 and output antenna 512.

Figure 5C:
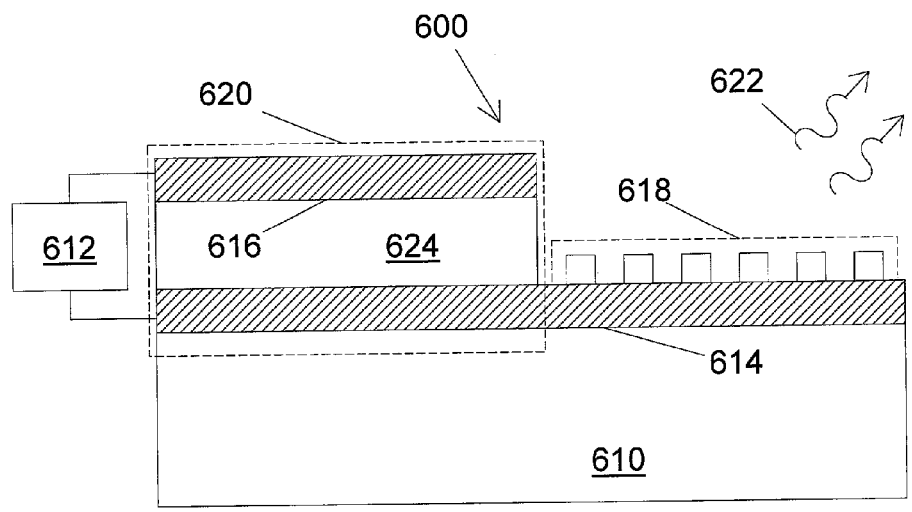
FIG. 5C is a diagrammatic illustration of a side view of an alternative configuration for the emitter designed in accordance with the present invention, shown here to illustrate an alternative output coupler including a grating.
Figure 5D:
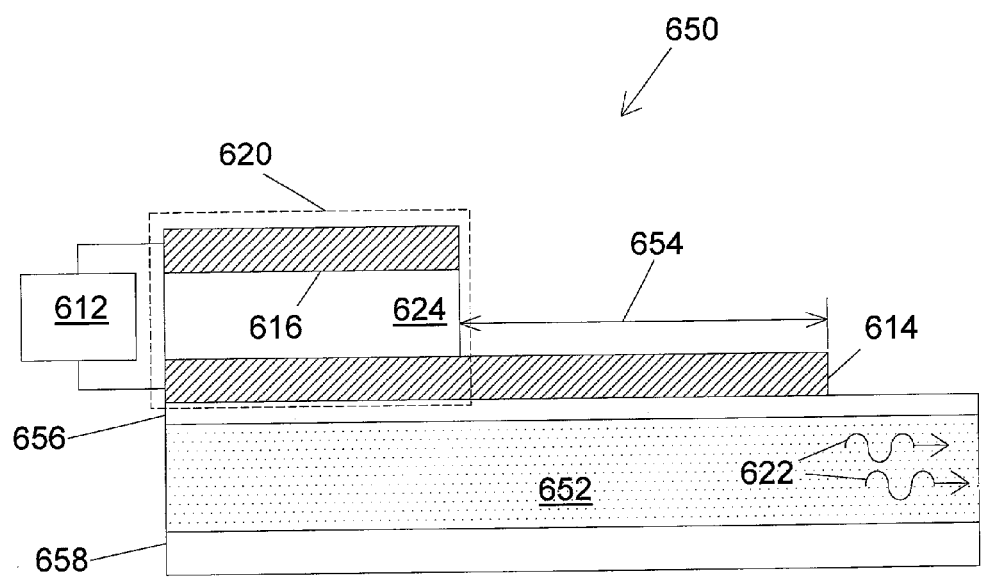
FIG. 5D is a diagrammatic illustration of a side view of another alternative configuration for the emitter designed in accordance with the present invention, shown here to illustrate another alternative output coupler including an evanescent wave coupler.

FIGS. 5C and 5D illustrate other output coupler options other than the output antenna shown in FIG. 5A for the emitter of the present invention. FIG. 5C shows an emitter 600 including an output grating coupler 618, indicated by dashed lines, for converting the surface plasmons generated in a surface plasmon waveguide region 620, enclosed by another set of dashed lines, into output electromagnetic radiation 622. Output grating coupler 618 works essentially the same way as output coupler 418 of FIG. 4B. Also, in FIG. 5D, an emitter 650 includes an electromagnetic waveguide region 652 with an output evanescent wave coupling region (indicated by a double headed arrow 654) for coupling out the surface plasmons generated in surface plasmon waveguide region 620. Output evanescent wave coupling region 654 functions in substantially the same way as output evanescent wave coupling region 456 as shown in FIG. 4C.

As a modification to the emitter embodiments illustrated in FIGS. 5A–5D, the surface plasmon waveguide regions can be designed to provide gain so as to generate not only surface plasmons by spontaneous emission but also additional surface plasmons by stimulated emission. Such a surface plasmon waveguide region can be implemented by appropriate design of the insulating arrangement disposed between the first and second metal layers. For example, a layered design such as the one used in gain region 230 of the detector with gain shown in FIG. 3 can be used in insulating arrangement 524 or 624, with a modification that insulating arrangements 524 and 624 are further configured to maximize spontaneous emission of surface plasmons.

Figure 6A:
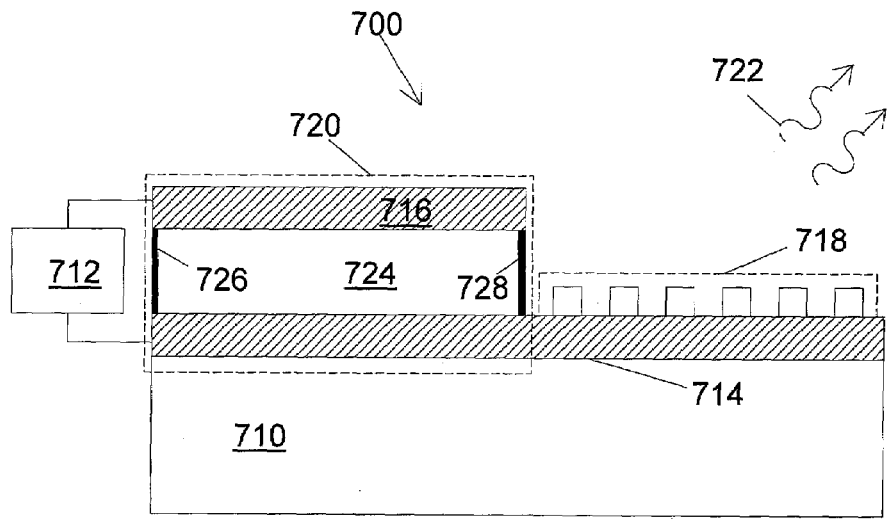
FIG. 6A is a diagrammatic illustration of a side view of a laser including a plasmon wave resonator designed in accordance with the present invention, shown here to illustrate an implementation including an output grating coupler.

Turning now to FIG. 6A, a laser 700 designed in accordance with the present invention is described. Laser 700 is based on a substrate 710 and also includes an input current source 712. Like in the aforedescribed devices of the present invention, a first metal layer 714 and a second metal layer 716 serve as the outer metal layers of a tunneling junction structure. An insulating arrangement 724 is disposed between first metal layer 714 and second metal layer 716 such that a gain region (indicated by a set of dashed lines 720) is formed, as in the aforedescribed amplifier and the detector with gain. Gain region 720 further includes a first reflector 726 and a second reflector 728 defining a resonant cavity therebetween. Gain region 720 is configured to receive input current from input current source 712 such that tunneling electrons are caused to tunnel between first metal layer 714 and second metal layer 716. As in the case of the aforedescribed amplifier as shown in FIGS. 4A–4C, the tunneling electrons in turn generate coherent, surface plasmons within the resonant cavity by stimulated emission so as to provide gain. Second reflector 728 is designed to be partially transmissive such that a portion of the surface plasmons thus generated are directed to an output grating coupler (indicated by another set of dashed lines 718) and coupled out of laser 700 as output electromagnetic radiation 722. Since the additional surface plasmons are generated by stimulated emission, the resulting output electromagnetic radiation is coherent.

The linewidth of output electromagnetic radiation 722 can be made very narrow by designing the gain region to minimize the probability of spontaneous emission occurring therein. For example, insulating arrangement 724 can include one or more dielectric layers, one or more additional metal layers or one or more discontinuous metal layers, such as quantum dots. Additionally, by using the double- or triple-barrier tunneling structure, for instance, the gain region of the laser can be designed to maximize the probability of stimulated emission of additional surface plasmons while minimizing the probability of stimulated absorption of the surface plasmons within the tunneling junction structure. The linewidth is also a function of the resonant cavity length and the resonant cavity Q-factor, which can both be appropriately controlled in the design and fabrication processes. Since the slow-mode surface plasmon within gain region 720 has a much higher propagation constant than the fast-mode surface plasmon, the reflectivity of second reflector 728 should be quite high, thus increasing the Q-factor of the resonant cavity. Also, by altering the input current, the wavelength and/or intensity of the output electromagnetic radiation can be tuned. Furthermore, an active feedback arrangement, as described above, can be added to enhance the output stability of the device. An example design of the tunneling junction structure in a laser is a triple-barrier, double quantum well structure using, for instance, tantalum oxide or aluminum oxide for the barrier layers and niobium oxide or thin metal layers for the quantum wells. The width of the laser cavity should be chosen (for example, a half-wave of the design wavelength) so as to null out any laterally propagating plasmons.

Figure 6B:
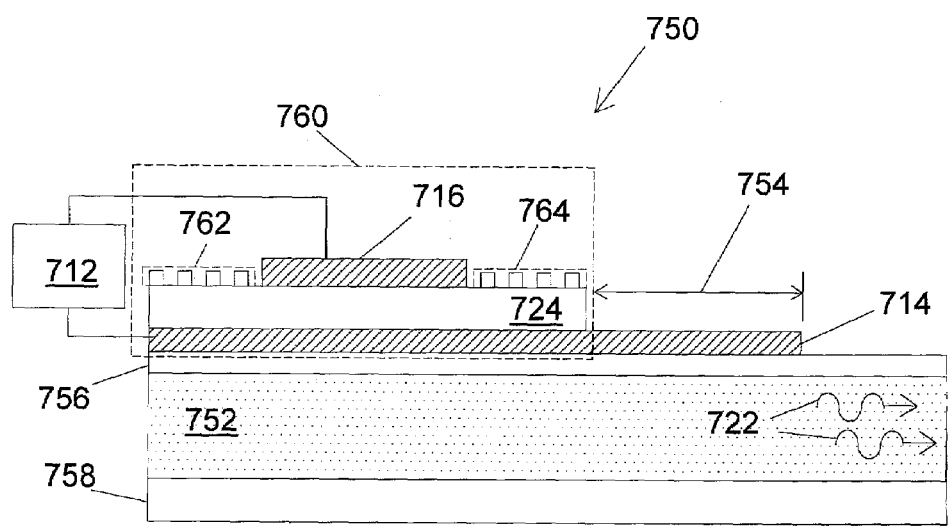
FIG. 6B is a diagrammatic illustration of a side view of an alternative configuration for the laser designed in accordance with the present invention, shown here to illustrate an alternative resonator cavity configuration including distributed Bragg reflectors and an alternative output coupler including an evanescent wave coupler.

A modification to the laser of FIG. 6A is shown in FIG. 6B. A laser 750 includes an electromagnetic waveguide region 752. Output grating coupler 718 of laser 700 of FIG. 6A is replaced with an output evanescent wave coupling region (indicated by double headed arrow 754), which output evanescent wave coupling region is configured to couple the surface plasmons directed thereon into electromagnetic waveguide region 752 as output electromagnetic radiation 722. Output evanescent wave coupling region 754 functions in substantially the same way as output evanescent wave coupling region 456 as shown in FIG. 4C. As in output evanescent coupling region 456, first metal layer 714 should be thin in order for the surface plasmon at the top interface of the first metal layer to couple into waveguide region 752 below. Furthermore, the resonant cavity in gain region 760 is defined by a first distributed Bragg reflector 762 and a second distributed Bragg reflector 764. First and second distributed Bragg reflectors 762 and 764 are configured to reflect surface plasmons of a predetermined frequency at which the gain region is designed to provide gain.

Figure 7A:
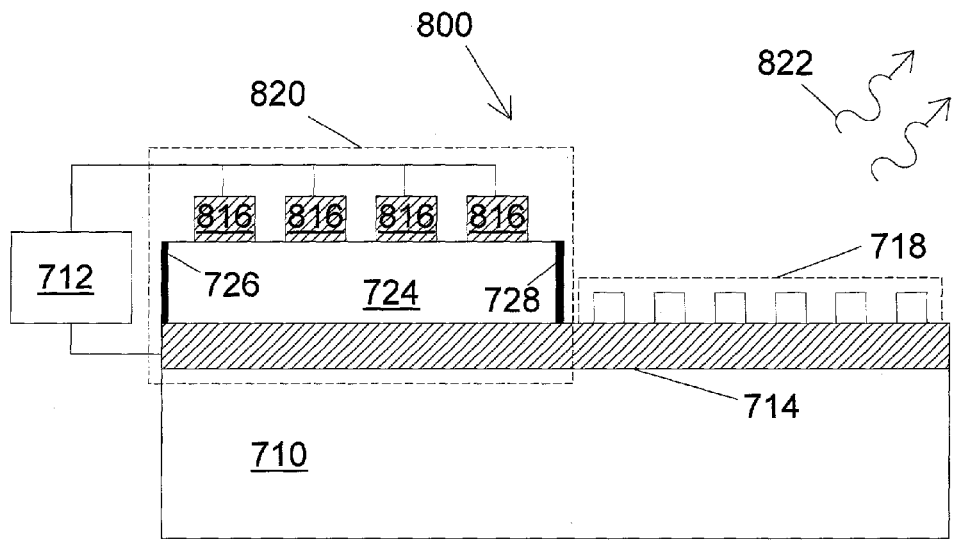
FIG. 7A is a diagrammatic illustration of a side view of another alternative configuration for the laser designed in accordance with the present invention, shown here to illustrate an alternative plasmon wave resonator configuration including gain regions at the cavity nodes of the resonator.

FIG. 7A illustrates another modification to the laser shown in FIG. 6A. A laser 800 is generally the same in configuration as laser 700 of FIG. 6A. However, in laser 800, a gain region (enclosed by dashed lines 820) includes a plurality of metal segments 816 such that a tunneling junction structure is formed only between each metal segment 816 and first metal layer 714 and, as a result, gain is provided only between each metal segment 816 and first metal layer 714. Since the resonant cavity defined by first and second reflectors 726 and 728 has specific regions therein where nodes of the optical field are located, the position of metal segments 816 is designed such that gain is efficiently provided at those cavity nodes and not at antinodes where the thin tunneling junctions would only contribute to optical loss.

Figure 7B:
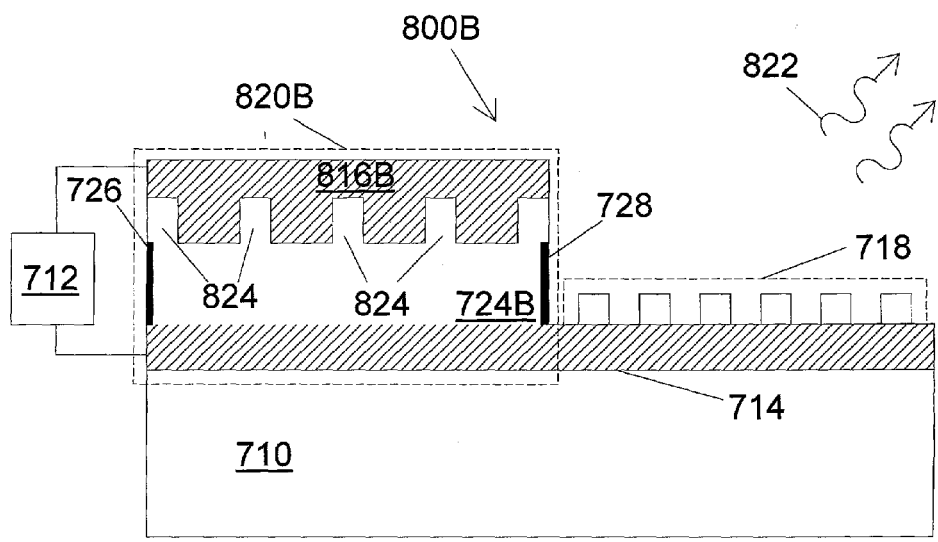
FIG. 7B is a diagrammatic illustration of a side view of yet another alternative configuration for the laser designed in accordance with the present invention, shown here to illustrate another alternative plasmon wave resonator configuration including gain regions at the cavity nodes of the resonator.

FIG. 7B shows an alternative embodiment of the laser of FIG. 7A with gain provided at cavity nodes only. Laser 800B is substantially similar in configuration to laser 800 of FIG. 7B, but metal segments 816 of laser 800 are connected together into a segmented electrode 816B in laser 800B. Segmented electrode 816B is configured such that a plurality of insulating blocks 824, which are integrally formed from insulating arrangement 724B, fill in between the conducting segments in the segmented electrode. In this way, gain is provided at the cavity nodes of the resonant cavity. A further advantage of the segmented electrode configuration as shown in FIG. 7B is that the slow mode surface plasmon propagation of the traveling wave is maintained while loss is reduced due to the thicker tunneling junction. Still further, the regions defined by insulating blocks 824 can also be designed to act as resonant layers.

Figure 8A:
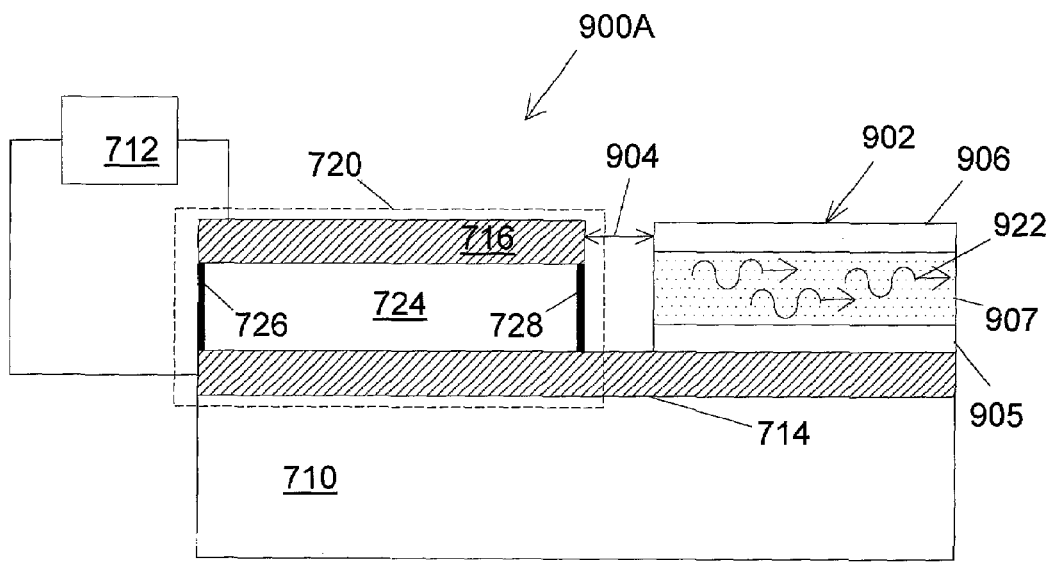
FIG. 8A is a diagrammatic illustration of a side view of still another alternative configuration for the laser designed in accordance with the present invention, shown here to illustrate an alternative output coupler including a gap coupler configuration.
Figure 8B:
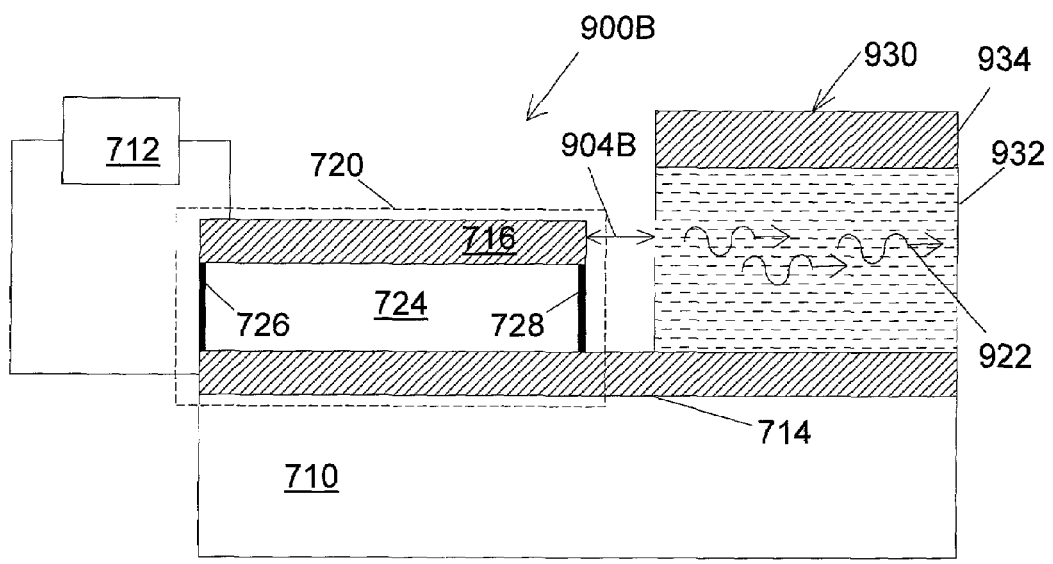
FIG. 8B is a diagrammatic illustration of a side view of another alternative configuration for the laser, which is designed in accordance with the present invention and includes a gap coupler into a MIM waveguide.

Still other possible modifications to the laser of the present invention are illustrated in FIGS. 8A and 8B. In FIG. 8A, a laser 900 is similar in structure to laser 700 of FIG. 6A with the same gain region and resonant cavity configuration. However, instead of an output grating coupler, laser 900A includes a gap coupler configuration including a waveguide structure 902 separated from gain region 720 by a gap (indicated by a double headed arrow 904). Waveguide structure 902 includes barrier layers 905 and 906 surrounding a dielectric waveguide 907. A portion of the surface plasmons from the resonant cavity then couples across the gap and into waveguide structure 902 as output electromagnetic radiation 922. The width of gap 904 determines the amount of output electromagnetic radiation that is coupled out of the resonant cavity and the gap width may be, for example, a quarterwave or less of the design wavelength.

Alternatively, the gap coupler configuration can include a MIM slow mode surface plasmon waveguide, as shown in FIG. 8B. A laser 900B includes a MIM waveguide 930 separated from gain region 720 by a gap (indicated by a double headed arrow 904B). MIM waveguide 930 includes a thick insulating layer 932 topped by an electrode 934. The thick insulating layer 932 helps to reduce loss of slow mode surface plasmon waves during propagation through the MIM waveguide.

Figure 8C:
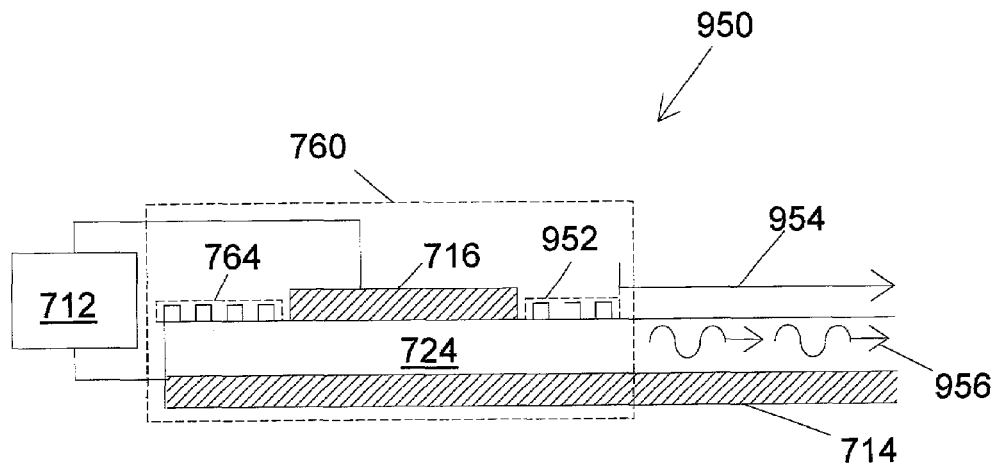
FIG. 8C is a diagrammatic illustration of a side view of yet another alternative configuration for the laser designed in accordance with the present invention, shown here to illustrate another alternative output coupler including a leaky reflector.

As yet another alternative, a laser 950 shown in FIG. 8C is similar to laser 750 of FIG. 6B. However, the second distributed Bragg reflector 764 of laser 750 is replaced with a leaky distributed Bragg reflector (indicated by dashed lines 952), which leaky distributed Bragg reflector 952 allows a predetermined amount of the surface plasmons within the resonant cavity to be coupled out to a waveguide section 954 provided adjacent to the resonant cavity. In this case, the "leakiness" or of the amount of transmission allowed through the leaky reflector determines the amount of the surface plasmons that is coupled out of the resonant cavity. The "leakiness" of the reflector can be controlled, for example, by the number of alternating dielectric layers used in the dielectric stack forming the leaky reflector. That is, a reflector with fewer dielectric layers will result in higher transmission.

Figure 8D:
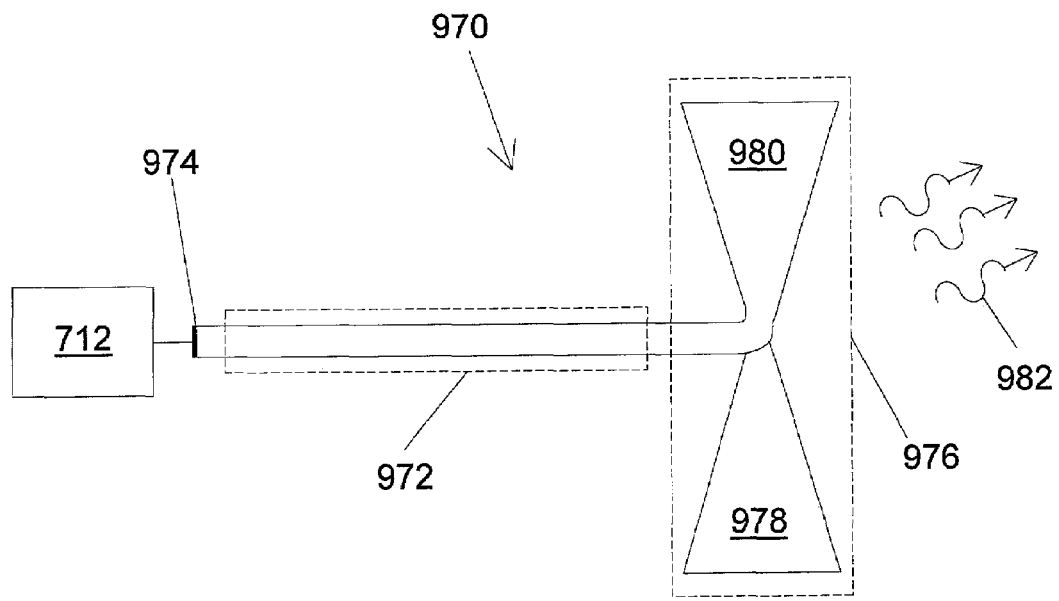
FIG. 8D is a diagrammatic illustration of a side view of still another alternative configuration for the laser, which is designed in accordance with the present invention and includes an impedance mismatched antenna as the output coupler.

Alternatively, an impedance-mismatched output antenna can be used as the partially transmissive reflector such that a predetermined amount of the surface plasmons within the resonant cavity is coupled out of the antenna as the output electromagnetic radiation. For example, as shown in FIG. 8D, a laser 970 includes a gain region 972 disposed between an input reflector 974 and an impedance mismatched antenna (indicated by dashed lines 976). Impedance mismatched antenna 976 is formed from a first metal layer 978 and a second metal layer 980, which also form gain region 972. The intentional impedance mismatch between gain region 972 and the antenna structure provides high reflection of slow mode surface plasmon waves back into gain region 972, thus effectively forming a resonant cavity surrounding gain region 972. The impedance mismatch should also be designed such that a certain amount of surface plasmon waves are allowed to couple out through impedance mismatched antenna 976 in order for laser 970 to provide output electromagnetic radiation 982.

Figure 9A:
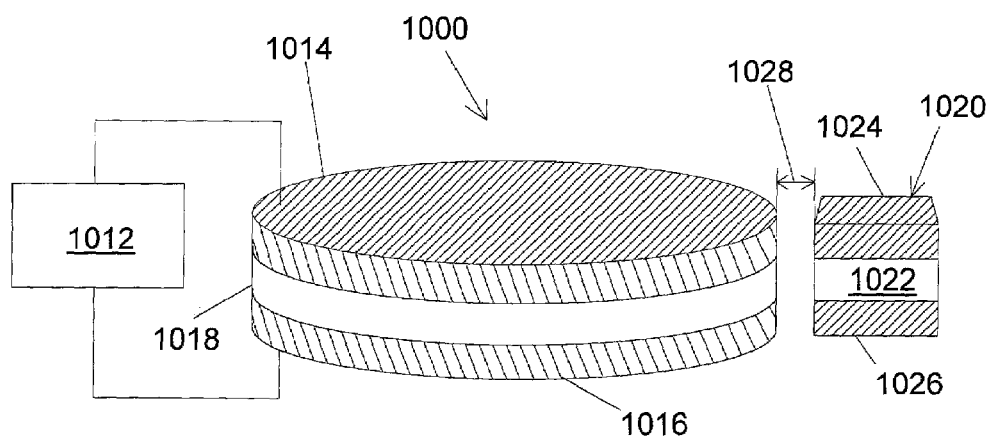
FIG. 9A is a diagrammatic illustration in perspective view of a ring laser designed in accordance with the present invention.

As another alternative embodiment of the laser of the present invention, a ring laser 1000 designed in accordance with the present invention is illustrated in FIG. 9A. An input current is provided by an input current source 1012 across a first metal layer 1014 and a second metal layer 1016 with an insulating arrangement 1018 disposed therebetween. First metal layer 1014, second metal layer 1016 and insulating arrangement 1018 are configured to form a circular, tunneling junction structure such that the input current causes tunneling electrons to tunnel between the first and second metal layers and, consequently, to generate surface plasmons within the circular, tunneling junction. The circular, tunneling junction structure is configured such that the tunneling junction itself serves to confine the generated surface plasmons therein such that additional surface plasmons are generated by stimulated emission. The output signal can be coupled out, for example, by evanescent coupling by adding an MIM slow mode waveguide 1020 adjacent to, but slightly separated from, the edge of the ring laser. Waveguide 1020 includes, for example, an insulator layer 1022 sandwiched between metal layers 1024 and 1026. Waveguide 1020 is separated from ring laser 1000 by a gap (indicated by double-headed arrow 1028) such that light from ring laser 1000 is coupled into waveguide 1020 by evanescent wave coupling.

Figure 9B:
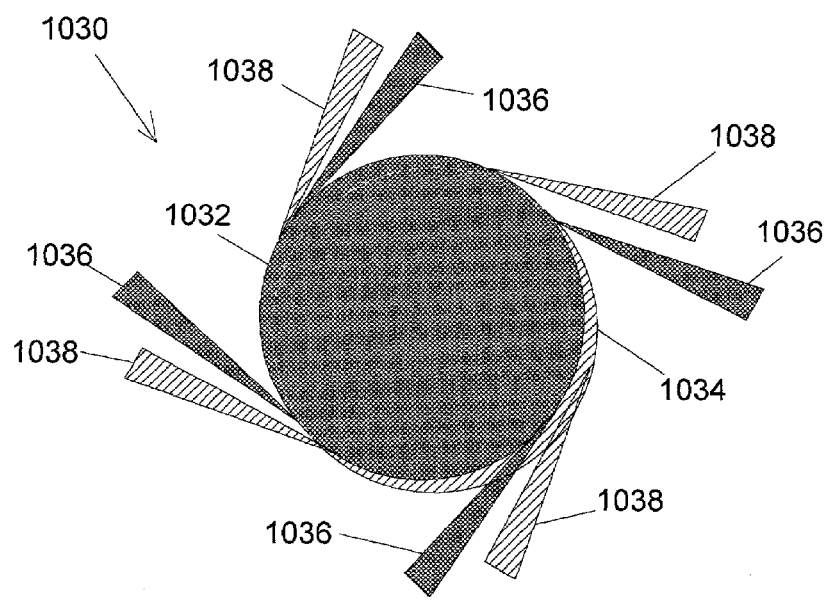
FIG. 9B is a diagrammatic illustration in perspective view of an alternative configuration for the ring laser designed in accordance with the present invention, shown here to illustrate an alternative output coupling configuration.

Alternatively, for instance, a V-shaped antenna can be made to spiral out of the edge of the ring laser. For example, as shown in FIG. 9B, ring laser 1030 includes a first metal layer 1032 and a second metal layer 1034 with an insulating arrangement (not shown) disposed therebetween. A plurality of extensions 1036 and 1038 are integrally formed from first metal layer 1032 and second metal layer 1034, respectively, so as to form a plurality of V-shaped antennae. In this case, light incident on the ring laser would be funneled into the ring laser and/or emitted light would be coupled out of the ring laser.

As another alternative scheme for coupling light out of the ring laser of the present invention, one of the surfaces of the ring laser configuration (for example, first metal layer 1014 of ring laser 1000 as shown in FIG. 9A) can be made rough or patterned with a grating such that light would be emitted from the roughened or patterned surface. It would also be possible to have an edge emitting ring laser by appropriate finishing of the ring edge.

Figure 9C:
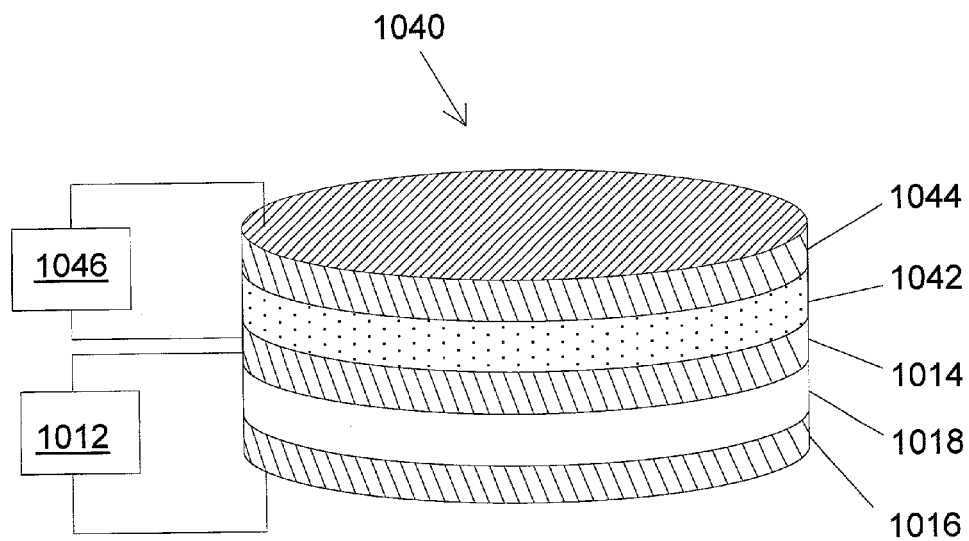
FIG. 9C is a diagrammatic illustration in perspective view of yet another alternative configuration for the ring laser designed in accordance with the present invention, shown here to illustrate an electrooptic layer configuration to provide a tunable ring laser.
Figure 9D:
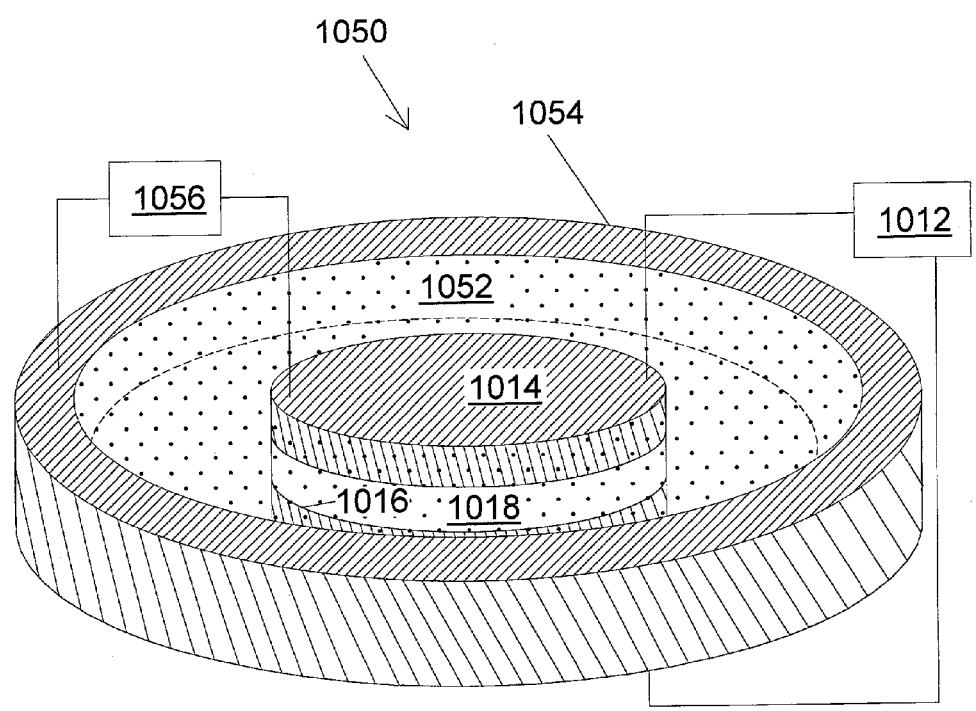
FIG. 9D is a diagrammatic illustration in perspective view of another alternative configuration for the ring laser, which is designed in accordance with the present invention and includes an annular electrooptic arrangement to provide another tunable ring laser.

A possible modification to the aforedescribed ring laser is to make it into a tunable ring laser. As illustrated in FIG. 9C, one way to achieve such a tunable ring laser 1040 is to make sure first metal layer 1014 is no thicker than approximately a skin depth at the optical frequency (~30 nm) so that the some of the surface plasmon electric field penetrates the electrode. Tunable ring laser 1040 also includes an electrooptic material 1042 on top of first metal layer 1014. Furthermore, a third metal layer 1044 is deposited on top of electrooptic material 1042 such that a voltage can be supplied from a voltage source 1046 across electrooptic material 1042 (i.e., between first metal layer 1014 and third metal layer 1044). The variable voltage thus supplied modulates the electrooptic properties of the electrooptic material such that the resonant wavelength of the surface plasmon wave in the ring laser is modulated, thus tuning the output wavelength from the tunable ring laser. Alternatively, as shown in FIG. 9D, the outer edge of the tunneling junction structure, which forms the ring laser, can be coated with an electrooptic material and an annular electrode layer. A tunable ring laser 1050 includes a circular tunneling junction structure formed by first metal layer 1014 and second metal layer 1016 with an insulating arrangement 1018 disposed therebetween such that input current can be applied between the first and second metal layers by input current source 1012. Tunable ring laser 1050 further includes an electrooptic material 1052 and a ring electrode 1054 surrounding the circular tunneling junction. A voltage source 1056 supplies a voltage between the ring electrode and first metal layer 1014, a portion of the surface plasmon field that penetrates into electrooptic material 1052 will produce a shift in the surface plasmon wavelength and hence shift the resonant frequency of tunable ring laser 1050.

Figure 10:
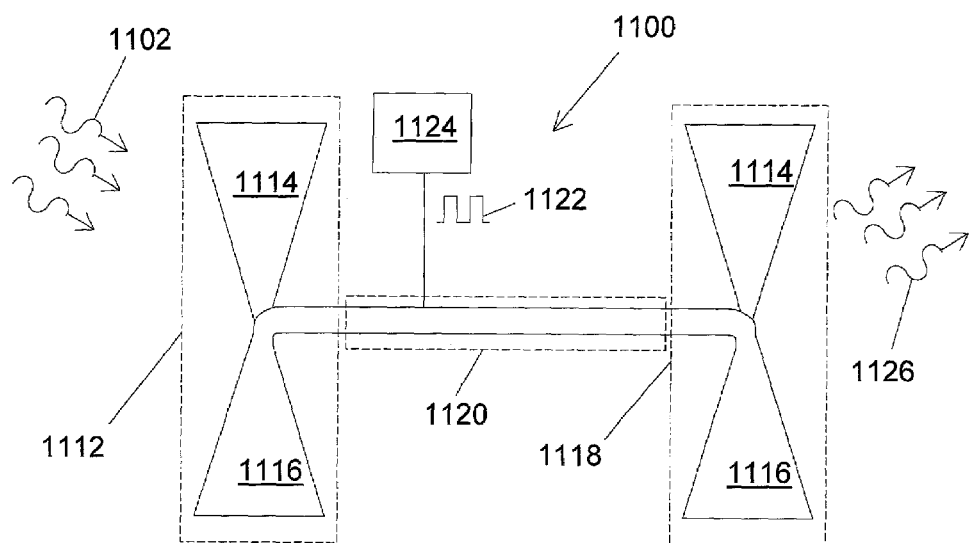
FIG. 10 is a diagrammatic illustration of a top view of a modulator designed in accordance with the present invention, shown here to illustrate an implementation including input and output antennae configurations.

Turning now to FIG. 10, a modulator 1100 designed in accordance with the present invention is shown. Modulator 1100 includes an input antenna (1112 enclosed in dashed lines 1112), which input antenna 1112 is formed at one end of a first metal layer 1114 and a second metal layer 1116. Input antenna 1112 is configured to receive input electromagnetic radiation 1102 and to convert the input electromagnetic radiation into surface plasmons. The opposing end of first metal layer 1114 and second metal layer 1116 form an output antenna (enclosed by another set of dashed lines 1118). First metal layer 1114 and second metal layer 1116 further form a tunneling junction structure (indicated by dashed lines 1120) between the input and output antennae. Tunneling junction structure 1120 is configured receive the surface plasmons from input antenna 1112 and to serve as a waveguide to direct the surface plasmons toward output antenna 1118 while absorbing a predetermined amount of the surface plasmons with a given absorption coefficient, as in the case of the aforedescribed detector shown in FIG. 1A. Furthermore, tunneling junction structure 1120 is configured to receive a modulation signal 1122 from a modulation input source 1124. Still further, tunneling junction 1120 is configured such that the absorption coefficient is altered in response to modulation signal 1122 so as to allow different amounts of the received surface plasmons from the input antenna to reach the output antenna depending on the modulation signal. The surface plasmons that reach output antenna 1118 are then coupled out of modulator 1100 as modulated output electromagnetic radiation 1126 such that the modulated output electromagnetic radiation displays at least one characteristic of modulation signal 1122, such as, for example, amplitude modulation. Amplitude modulation can be realized in this device, for example, by using modulation signal 1122 as a variable bias voltage across tunneling junction 1120 such that the probability of stimulated absorption (is modulated. If the insulator layer in the tunneling junction is made sufficiently thick, amplitude modulation can be decreased while increasing the amount of phase modulation. Thus, the nonlinearity in tunneling current induced by the surface plasmon effectively modifies the propagation constant of the slow mode surface plasmon wave through second and higher order nonlinearity values in a manner similar to the linear electro-optic effect in noncentrosymmetric crystals.

Figure 11:
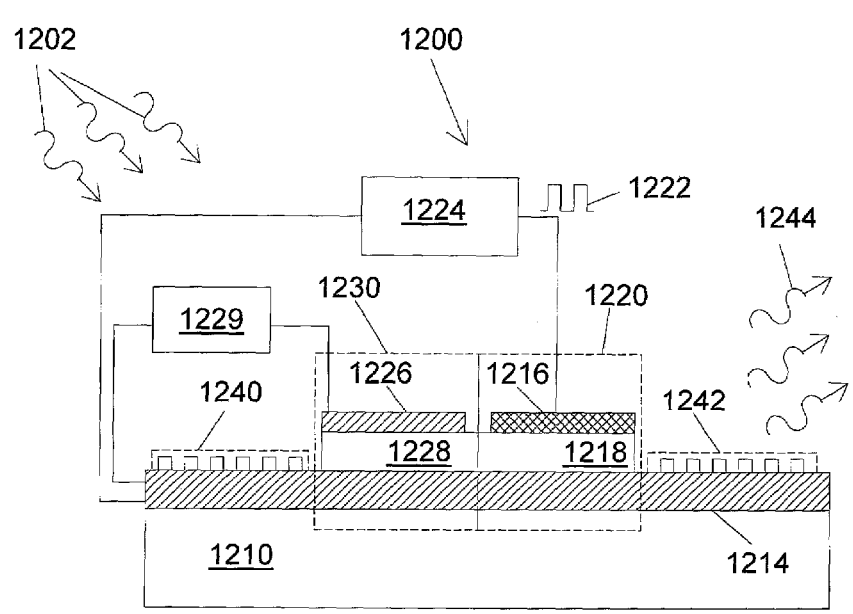
FIG. 11 is a diagrammatic illustration of a side view of a configuration for a modulator with a gain region designed in accordance with the present invention, shown here to illustrate an implementation including input and output grating couplers.

A possible modification to the aforedescribed modulator is shown in FIG. 11. A modulator 1200 of FIG. 11 is configured for modulating input electromagnetic radiation 1202 and includes a substrate 1210 on which a first metal layer 1214 is deposited. A second metal layer 1216 and a first insulating arrangement 1218, along with first metal layer 1214, together form a tunneling junction (enclosed in a set of dashed lines 1220). Tunneling junction 1220 is configured to receive a modulation signal 1222 from a modulation input source 1224 such that the absorption coefficient of tunneling junction 1220 is modulated in response to modulation signal 1222. Additionally, a third metal layer 1226 and a second insulating arrangement 1224, along with first metal layer 1214, together form a gain region (enclosed in dashed lines 1230) to serve as a surface plasmon "preamplifier" before tunneling junction 1220. Modulator 1200 further includes an input grating coupler (indicated by dashed lines 1240), which input grating coupler is configured to receive input electromagnetic radiation 1202 and to convert the input electromagnetic radiation so received into surface plasmons to be directed into gain region 1230. The surface plasmons cause tunneling electrons to tunnel between first metal layer 1214 and third metal layer 1226 such that additional surface plasmons are produced in gain region 1230 by stimulated emission. The surface plasmons so produced are then directed into tunneling junction 1220, which absorbs different amounts of the surface plasmons depending on modulation signal 1222 while allowing the remainder of surface plasmons to reach an output grating coupler 1242, indicated by another set of dashed lines. Output grating coupler 1242 then couples the remaining surface plasmons out of modulator 1200 as modulated output electromagnetic radiation 1244. In this way, modulator 1200 provides gain as well as modulation in the output electromagnetic radiation 1244.

Still other modifications are possible to the embodiments of the modulator of the present invention. Aforedescribed antireflection layers can be positioned between the input couplers and the tunneling junction and/or the tunneling junction and the output couplers to minimize the surface plasmon losses during propagation through the device. The insulating arrangement in the tunneling junction can be designed to maximize the modulation in the absorption coefficient induced by the modulation signal. For example, the insulating arrangement can include multiple layers of dielectrics and/or metals to enhance this feature. That is, the higher the nonlinearity in the tunneling junction current-voltage curve, the more efficient the modulation will be. Thus, resonant tunneling structures, such as those described in the aforementioned co-assigned and copending patent applications and those of double- and triple-barrier diodes, would yield the highest modulation efficiency—highest change in optical properties at lowest change in voltage/current. Other output couplers, such as the evanescent wave coupler described above, and combinations of different output couplers can also be used in the modulator.

As a possible modification to the aforedescribed modulator, it is often desirable to increase the degree of phase modulation produced relative to the degree of amplitude modulation to form a modulator that has low insertion loss. One way to accomplish this is to increase the thickness of the insulating layer above that of an efficient detector, such that the tunneling probability across it is decreased. The result is that the loss from amplitude modulation is reduced, allowing the phase modulation to dominate.

Figure 12:
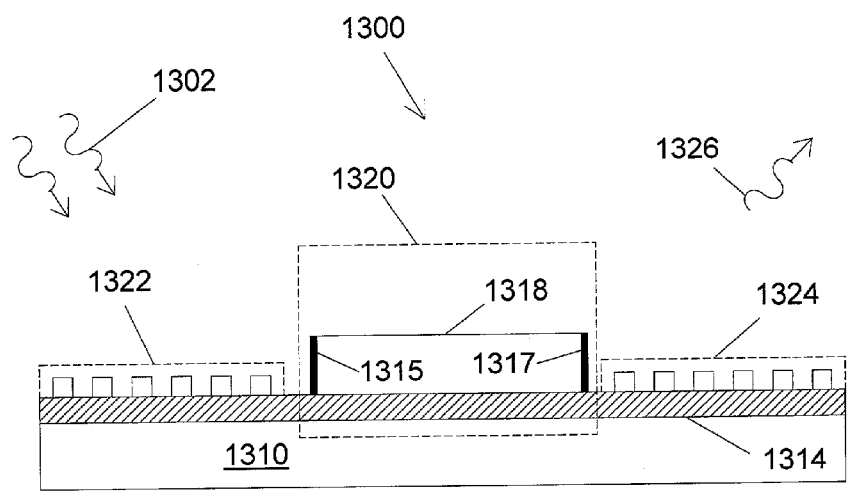
FIG. 12 is a diagrammatic illustration of a side view of a filter designed in accordance with the present invention, shown here to illustrate an implementation including end reflectors and input and output grating couplers.

Turning now to FIG. 12, a filter 1300 designed in accordance with the present invention is shown as an example of a surface plasmon device which does not require a tunneling junction structure. Filter 1300 is essentially a resonant cavity surface plasmon filter which is designed to filter the desired frequencies out of an input electromagnetic radiation 1302 having a range of input frequencies. Filter 1300 includes a substrate 1310 on which a first metal layer 1314 has been deposited. Filter 1300 further includes a first reflector 1315 and a second reflector 1317 positioned at opposing facets of an insulating arrangement 1318. Insulating arrangement 1318 can be, for example, a layer of dielectric material or even air. First reflector 1315 and second reflector 1317 define a resonant cavity across insulating arrangement 1318. First metal layer 1314, first and second reflectors 1315 and 1317 and insulating arrangement 1318 together form a filtering region (enclosed in dashed lines 1320). Filter 1300 also includes an input grating coupler 1322, which is configured to receive input electromagnetic radiation 1302 and to convert the electromagnetic radiation so received into surface plasmons to be directed into filtering region 1320. The filtering region is configured like a Fabry-Perot resonant cavity to only transmit predetermined frequencies of surface plasmons waves such that only surface plasmons of those predetermined frequencies are directed into an output grating coupler 1324 to be coupled out as output electromagnetic radiation 1326.

Figure 13:
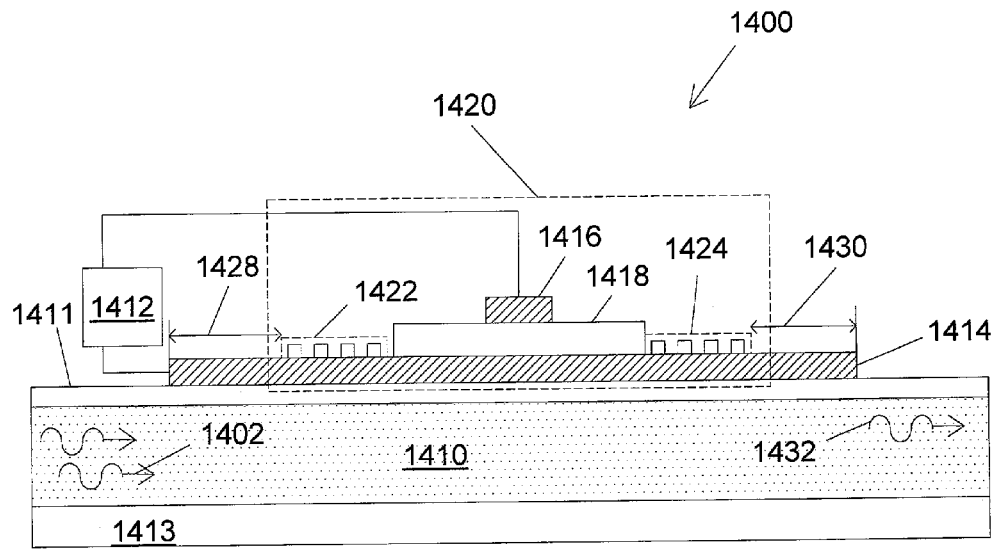
FIG. 13 is a diagrammatic illustration of a side view of a tunable filter designed in accordance with the present invention, shown here to illustrate an implementation including distributed Bragg reflectors and input and output evanescent wave couplers.

Various modifications may be made in the filter of the present invention. For example, a tunable filter 1400 shown in FIG. 13 is designed to filter input electromagnetic radiation 1402 received via an electromagnetic waveguide region 1410, which is surrounded by barrier region 1411 and 1413. A first metal layer 1414 is disposed on top of electromagnetic waveguide region 1410. A tuning input source 1412 is configured to supply a tuning input (e.g., a variable electrical voltage or current, not shown) via an electrode 1416 across an insulating arrangement 1418 so as to tune a material property of the insulating arrangement depending on the tuning input. For example, the tuning input, such as a variable electrical voltage applied across the insulating arrangement, can cause a change in the refractive index of an electro-optic material 1418. A filtering region (enclosed in dashed lines 1420) includes a portion of first metal layer 1414, insulating arrangement 1418, with electrode 1416 thereon, a first distributed Bragg reflector 1422 and a second distributed Bragg reflector 1424. First and second distributed Bragg reflectors 1422 and 1424, positioned on opposite sides of insulating arrangement 1418, together define a resonant cavity. Therefore, by applying the tuning input across insulating arrangement 1418, the effective path length of the resonant cavity is altered and, as a result, the wavelength and hence resonant frequency of the surface plasmons allowed through the resonant cavity is changed.

Figure 14:
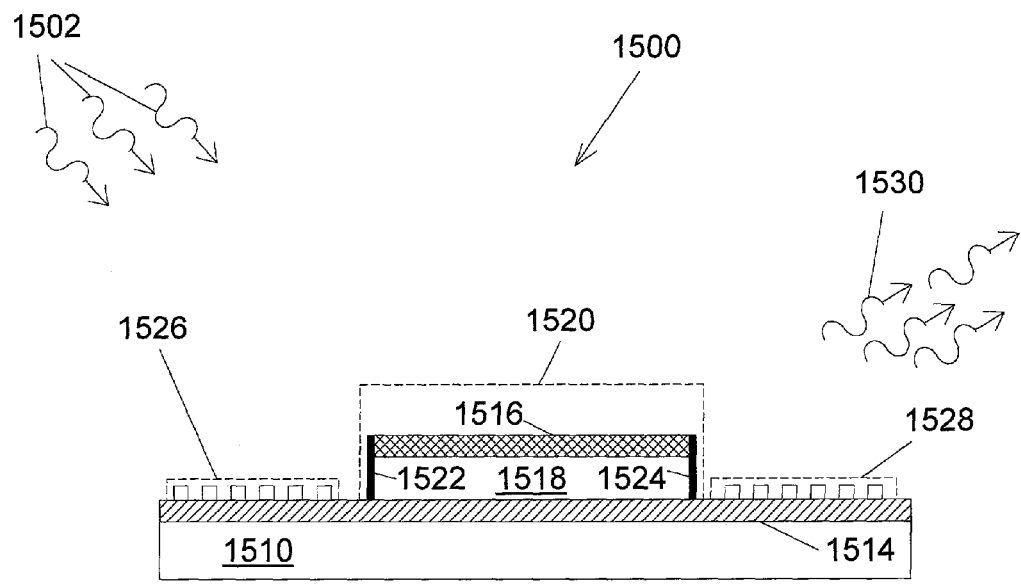
FIG. 14 is a diagrammatic illustration of a side view of an alternative configuration for the tunable filter designed in accordance with the present invention, shown here to illustrate an implementation including end reflectors, input and output grating couplers and a tunneling junction region.

As another modification to the filter of the present invention, a tunneling junction structure can be incorporated into the resonant cavity to provide gain to the surface plasmons within the resonant cavity such that the intensity of the output electromagnetic radiation is increased. For example, a filter 1500 shown in FIG. 14 is configured to filter input electromagnetic radiation 1502 and includes a substrate 1510 with a first metal layer 1514 deposited thereon. Filter 1500 further includes a second metal layer 1516 and an insulating arrangement 1518 which, together with first metal layer 1514, form a tunneling junction (enclosed by dashed lines 1520). In this case, insulating arrangement 1518 is configured so as to provide additional surface plasmons within tunneling junction 1520 by stimulated emission, as in the case of the aforedescribed amplifier of the present invention. Tunneling junction 1520 also includes a first reflector 1522 and a second reflector 1524 defining a resonant cavity. In this way, output electromagnetic radiation 1530 coupled out of filter 1500 will be stronger in intensity than if the tunneling junction were not present. In other words, filter 1500 acts essentially as an tuned amplifier.

Figure 15:
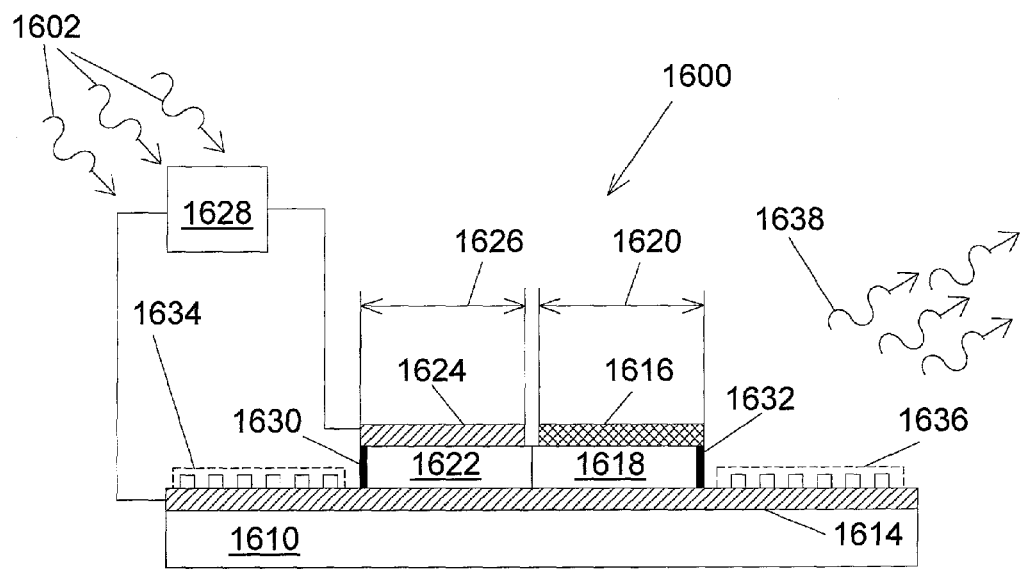
FIG. 15 is a diagrammatic illustration of a side view of a tunable filter with gain designed in accordance with the present invention, shown here to illustrate an implementation further including a tuning region and a gain region with input and output grating couplers.

As still another modification, an electro-optic material and the tunneling junction structure can both be incorporated into the resonant cavity structure simultaneously so as to provide a tunable amplifier. Such a filter 1600, which is configured to filter input electromagnetic radiation 1602, is shown in FIG. 15. Filter 1600 includes a substrate with a first metal layer 1614 positioned thereon. A second metal layer 1616 and an insulating arrangement 1618, together with first metal layer 1614, define a tunneling junction 1620, indicated by a double headed arrow, which tunneling junction is configured to provide gain as described above. Filter 1600 further includes an electro-optic material 1622 with an electrode 1624 disposed thereon to form a tuning block 1626, indicated by another double headed arrow. Tuning block 1626 is configured to receive a tuning input (such as an electrical voltage) from a tuning input source 1628 such that an electro-optic property of electro-optic material 1622 is altered by the tuning input. A first reflector 1630 and a second reflector 1632 are positioned on opposing ends of the combination of the tuning block and the tunneling junction so as to define a resonant cavity. Therefore, by applying the tuning input to electro-optic material 1622, the resonance condition within the resonant cavity can be changed, thus altering the frequency of surface plasmons allowed therethrough.

Figure 16:
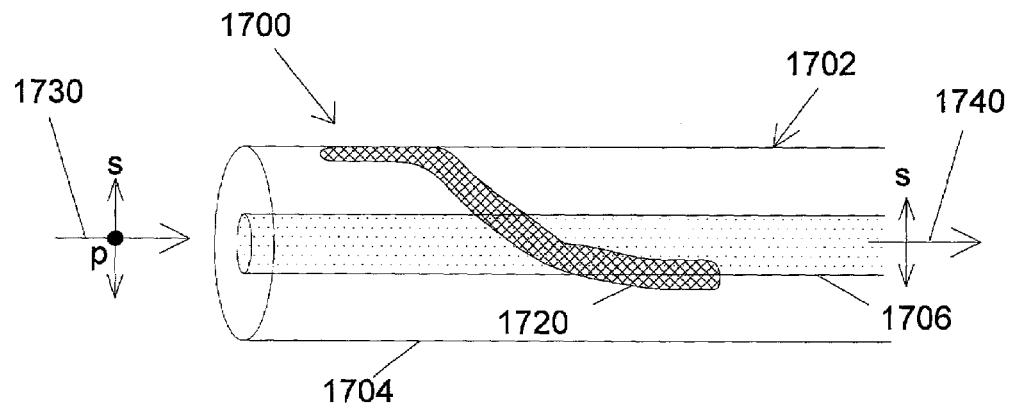
FIG. 16 is a diagrammatic illustration in perspective view of a waveguide polarization device designed in accordance with the present invention, shown here to illustrate an implementation including an optical fiber and a shaped, metal strip.

As another device based on the control of surface plasmons in conjunction with a waveguide structure in accordance with the present invention, a waveguide polarization device 1700 is shown in FIG. 16. The waveguide polarization device of the present invention takes advantage of the fact that surface plasmon generation and propagation is polarization sensitive. Waveguide polarization device 1700 includes an optical fiber 1702, which in turn includes a cladding 1704 surrounding a fiber core 1706. A metal strip 1720 is arranged around the optical fiber in a helical fashion (i.e., the metal strip winds around the optical fiber by a quarter turn, in the embodiment shown in FIG. 16). When an input electromagnetic radiation 1730, including s- and p-polarization states, is propagated through the optical fiber and encounters the metal strip, the initially p-polarized component of the input electromagnetic radiation propagates along metal strip 1720 as a surface plasmon wave while the initially s-polarized component travels through the optical fiber substantially unaffected. Due to the orientation of metal strip 1720 around the optical fiber, the surface plasmon wave propagating along metal strip 1720 is rotated in polarization such that, at the end of the metal strip, the surface plasmon wave is converted to an s-polarized electromagnetic radiation, which then becomes combined with the initially s-polarized component to produce an s-polarized, output electromagnetic radiation 1740. That is, at the end of the metal strip, the output electromagnetic radiation is s-polarized. Thus, by proper configuration of the metal strip, the waveguide polarization device of the present invention can serve, for example, as a polarization combiner (if the metal strip rotates the polarization of the p-polarized component by 90-degrees as described above while leaving the s-polarized component unchanged) or to provide phase delay (if the metal strip rotates the polarization of the p-polarized component by 180 degrees; i.e., the metal strip winds helically around the optical fiber by a half turn, rather than a quarter turn).

Figure 17:
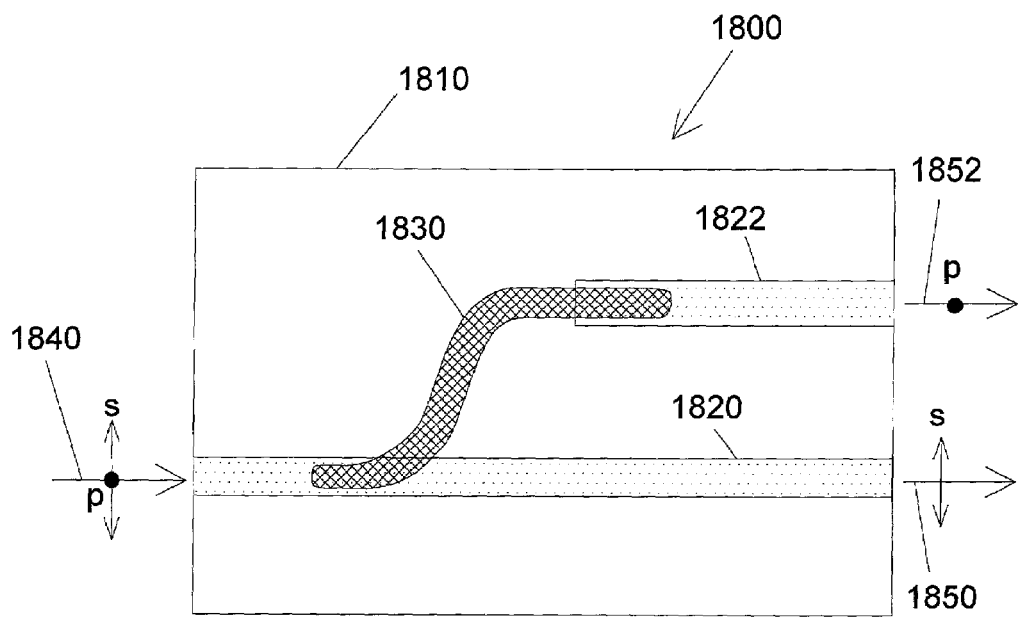
FIG. 17 is a diagrammatic illustration of a top view of a polarizing beam splitter designed in accordance with the present invention, shown here to illustrate an implementation including slab waveguides.

Another device which takes advantage of the polarization-dependence of the surface plasmon wave generation is a polarizing beam splitter as shown in FIG. 17. Polarizing beam splitter 1800 includes a substrate 1810 on which first and second dielectric waveguide sections 1820 and 1822 are arranged. First and second dielectric waveguide sections 1820 and 1822 are connected by a metal strip 1830 leading from first dielectric waveguide section 1820 to second dielectric waveguide section 1822. An input electromagnetic radiation 1840, including s- and p-polarization states, is coupled into the first dielectric waveguide section. When input electromagnetic radiation 1840 encounters metal strip 1830, the initially p-polarized component of the input electromagnetic radiation propagates along the metal strip as a surface plasmon wave while the initially s-polarized component travels through first dielectric waveguide section 1820 essentially unaffected. In this way, the initially s-polarized component of input electromagnetic radiation 1840 is directed through first dielectric waveguide section 1820 as a first output electromagnetic radiation 1850 with s-polarization, while the initially p-polarized component is directed through second dielectric waveguide section 1822 as a second output electromagnetic radiation 1852 with p-polarization. Thus, the initially s- and p-components of input electromagnetic radiation 1840 has been split into two beams, each having only s- or p-polarized electromagnetic radiation.

Figure 18:
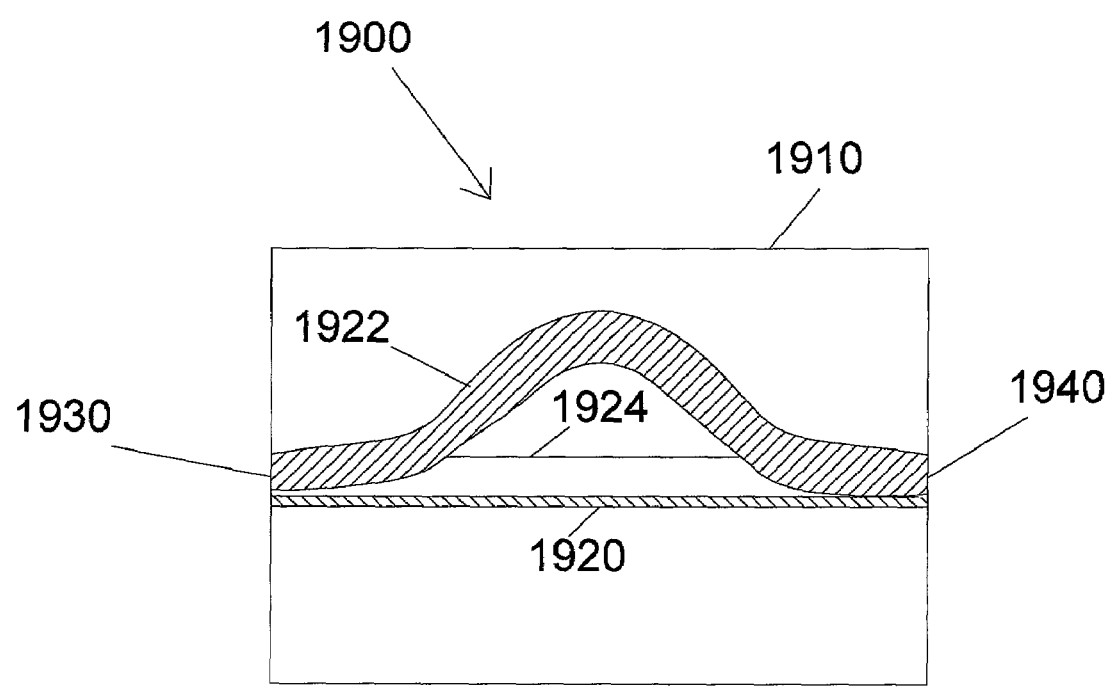
FIG. 18 is a diagrammatic illustration in perspective view of a slow mode-fast mode plasmon wave converter designed in accordance with the present invention, shown here to illustrate an implementation on a slab substrate.

Turning now to FIG. 18, a slow mode—fast mode converter 1900 is disclosed. As discussed in the foregoing description of the devices of the present invention, one of the considerations in considering surface plasmon propagation through a device is the fact that three modes of surface plasmon waves (i.e., two fast modes and one slow mode) are simultaneously generated. Although the slow mode interacts more strongly with tunneling electrons in a tunneling junction structure, the slow mode also is more lossy. The fast modes tend to interact less strongly with electrons but have longer propagation lengths. It is sometimes desirable to be able to convert from the slow mode to the fast mode and vice versa. In general, the difference between slow mode and fast mode surface plasmon waves in a tunneling junction structure is that, in slow mode surface plasmons, the electromagnetic field component propagating along the interface between the bottom metal layer and the middle insulating layer(s) is out of phase with the electromagnetic field component traveling along the interface between the middle insulating layer(s) and the top metal layer. In fast mode surface plasmon waves, the electromagnetic field components traveling along the two interfaces are in phase. Therefore, in order to convert from the fast mode to the slow mode and vice versa, it is necessary to manipulate the relative phase of the electromagnetic field components of the surface plasmon waves at the different interfaces.

Slow mode—fast mode converter 1900, shown in perspective in FIG. 18, includes a substrate on which a first metal strip 1920 and a second metal strip 1922 has been deposited, with an input port 1930 defined at one end of the metal strips and an output port 1940 defined at an opposing end of the metal strips. The metal strips are separated by an insulating arrangement 1924. As shown in FIG. 18, second metal strip 1922 includes an extra curved segment not found in first metal strip 1920. It should be noted that the curved segment forms a continuous curve rather than any abrupt turn or change in direction, thus preventing possible reflections at abrupt interfaces. Therefore, while the electromagnetic field component of a surface plasmon wave traveling along first metal strip 1920 travels straight across substrate 1910, the electromagnetic field component of the surface plasmon wave traveling along second metal strip 1922 is forced to travel an extra distance along the semicircular segment. By proper selection of the length of the semicircular segment, a 180-degree phase delay is introduced in the electromagnetic field component traveling along second metal strip 1922 relative to the electromagnetic field component traveling along first metal strip 1920 such that surface plasmon wave which is in the slow mode at an input port 1930 will be converted from a slow mode to one of the fast modes (and vice versa) at output port 1940. That is, slow mode–fast mode converter 1900 converts from the fast mode to the slow mode and vice versa by configuring the top metal layer to introduce an extra phase delay in the electromagnetic field component traveling along the top metal layer compared to the electromagnetic field component traveling along the bottom metal layer.

Various modifications to the converter as shown in FIG. 18 can be contemplated. For example, antireflection layers can be positioned between the input port and the semicircular segment and/or the semicircular segment and the output port to reduce coupling losses at the input and/or output. Also, the shape of the semicircular segment can be modified according to fabrication and performance requirements.

It is especially notable that the aforedescribed devices of the present invention are based on the concepts of the conversion of an input signal (electrical or electromagnetic) into surface plasmons within the devices, manipulation of the surface plasmon waves so generated within the devices, and the subsequent conversion of the manipulated, surface plasmons into an output signal (electrical or electromagnetic). That is, unlike, for example, the devices of Anemogiannis which merely modulate the evanescent wave components of input electromagnetic waves, the devices of the present invention converts essentially all of the energy of the input signal into surface plasmons so as to manipulate the energy of the surface plasmons themselves in achieving effects such as stimulated or spontaneous emission of additional surface plasmons and stimulated absorption of the surface plasmons. As a result, the modulation or signal frequency response may be RC limited, but the optical response of the aforedescribed devices of the present invention are not limited by RC considerations. Furthermore, the devices of the present invention include predetermined waveguide paths to guide the surface plasmon waves through the devices so as to provide sufficient interaction lengths to manipulate the surface plasmons in desired ways. Still further, the devices of the present invention are flexible in design such that they can be made very compact. Therefore, a plurality of the devices of the present invention can be combined on a single substrate. For example, a plurality of detectors can be formed on a single substrate to form an array, or a number of different devices can be combined to form an integrated optical structure.

Although each of the aforedescribed embodiments have been illustrated with various components having particular respective orientations, it should be understood that the present invention may take on a variety of specific configurations with the various components being located in a wide variety of positions and mutual orientations and still remain within the spirit and scope of the present invention. Furthermore, suitable equivalents may be used in place of or in addition to the various components, the function and use of such substitute or additional components being held to be familiar to those skilled in the art and are therefore regarded as falling within the scope of the present invention. For example, the aforedescribed devices can be combined with conventional optical elements, such as, but not limited to, lasers, detectors, optical fiber, lenses and photonic bandgap crystals. Various combinations of materials, such as superconductors, semiconductors and semimetals, can be incorporated into the aforedescribed devices in order to achieve desired performance and fabrication specifications. Two or more of the aforedescribed configurations of the present invention can be combined to achieve multi-purpose devices, such as, for example, a filtering detector. Atomic layer deposition (ALD) of the various thin well and barrier layers allows precise control of layer thickness and uniformity at the monolayer level, thus providing significant improvement in performance over previously reported tunneling junction devices (e.g., the devices of Aleksanyan et al. and Belenov et al. which are based on evaporated layers). The resonant tunneling effect through tunneling junction structures formed by ALD yields highly nonlinear current-voltage response and, subsequently, high efficiency. Furthermore, the smooth layers and interfaces formed by ALD can significantly reduce scattering loss of slow mode surface plasmon waves, which have relatively short wavelengths (e.g., approximately 200 nm for 200 THz radiation in $Al$—$Al_2O_3$—$Ag$ tunnel junction structures). Therefore, the present examples are to be considered as illustrative and not restrictive, and the invention is not to be limited to the details given herein but may be modified within the scope of the appended claims.

What is claimed is:

1. A detector for detecting input electromagnetic radiation incident thereon, said detector comprising:
   a) an input port configured to receive said input electromagnetic radiation;
   b) an output port; and
   c) a structure including a tunneling junction connected with said input port and said output port, said tunneling junction being configured in a way (i) which provides electrons in a particular energy state within said structure, (ii) which produces surface plasmons in response to said input electromagnetic radiation, (iii) which causes said structure to act as a waveguide for directing at least a portion of said surface plasmons along a predetermined path toward said output port such that the surface plasmons so directed interact with said electrons in a particular way, and (iv) which produces at said output port an output electrical signal resulting from said particular interaction between said electrons and said surface plasmons.

2. The detector of claim 1 wherein said input port includes an antenna structure for receiving said input electromagnetic radiation over a desired range of frequencies.

3. The detector of claim 1 wherein said input port includes a grating coupler for receiving said input electromagnetic radiation.

4. The detector of claim 1 wherein said input port includes an evanescent wave coupler for receiving said input electromagnetic radiation.

5. The detector of claim 1 wherein said particular interaction between said electrons and said surface plasmons causes at least a portion of said electrons to tunnel through said tunneling junction in order to produce said output electrical signal.

6. The detector of claim 1 wherein said structure further includes an antireflection layer disposed between said input port and said tunneling junction.

7. A detector for detecting input electromagnetic radiation incident thereon, said detector comprising:
   a) an input port configured to receive said input electromagnetic radiation;
   b) an output port; and
   c) a structure including first and second tunneling junctions connected with each other and with said input port and said output port, said first and second tunneling junctions being configured in a way (i) which provides electrons in a particular energy state within said structure, (ii) which produces surface plasmons in response to said input electromagnetic radiation, (iii) which causes said structure to act as a waveguide for directing at least a portion of said surface plasmons along a predetermined path toward said output port such that the plasmons so directed interact with said electrons in a particular way, and (iv) which produces an output electrical signal at said output port, wherein said output electrical signal results from said particular interaction between said electrons and said surface plasmons such that said output electrical signal is a function of said input electromagnetic radiation.

8. The detector of claim 7 wherein said first tunneling junction is further configured in a way which said particular interaction between said electrons and said surface plasmons causes at least a portion of said electrons to tunnel through said first tunneling junction such that additional surface plasmons are produced to provide a given gain, and such that said output electrical signal is produced with said given gain at said output as a result of said particular interaction between said electrons and said first mentioned surface plasmons and said additional surface plasmons.

9. The detector of claim 8 wherein said second tunneling junction is further configured such that said particular interaction includes absorption of said first mentioned surface plasmons and said additional surface plasmons by the second tunneling junction to produce said output electrical signal.

10. The detector of claim 7 wherein said second tunneling junction is further configured such that said particular interaction includes absorption of said surface plasmons by the second tunneling junction to produce said output electrical signal.

11. An amplifier for amplifying input electromagnetic radiation incident thereon, said amplifier comprising:
   a) an input port configured to receive said input electromagnetic radiation;
   b) an output port; and
   c) a structure including a tunneling junction connected with said input port and said output port, said tunneling junction being configured in a way (i) which provides electrons in a particular energy state within said structure, (ii) which produces surface plasmons in response to said input electromagnetic radiation, (iii) which causes said structure to act as a waveguide for directing at least a portion of said surface plasmons along a predetermined path toward said output port such that the surface plasmons so directed interact with said electrons in a particular way, and (iv) which produces an output electromagnetic radiation with a given gain at said output port, wherein said output electromagnetic radiation results from said particular interaction between said electrons and said surface plasmons.

12. The amplifier of claim 11 wherein said tunneling junction includes
   a) first and second non-insulating layers spaced apart from one another, and
   b) an arrangement disposed between the first and second non-insulating layers and configured to serve as a transport of electrons between said first and second non-insulating layers, said arrangement including at least two insulating layers.

13. The amplifier of claim 12 wherein said arrangement further includes at least one additional non-insulating layer.

14. The amplifier of claim 13 wherein said additional non-insulating layer is discontinuous.

15. The amplifier of claim 12 wherein at least one of said first and second non-insulating layers and said arrangement disposed between the first and second non-insulating layers is formed by atomic layer deposition.

16. The amplifier of claim 11 wherein said input port includes an input antenna structure for receiving said input electromagnetic radiation over a desired range of frequencies.

17. The amplifier of claim 11 wherein said input port includes an input grating coupler for receiving said input electromagnetic radiation.

18. The amplifier of claim 11 wherein said input port includes an input evanescent wave coupler for receiving said input electromagnetic radiation.

19. The amplifier of claim 11 wherein said particular interaction between said electrons and said surface plasmons causes at least a portion of said electrons to tunnel through said tunneling junction such that additional coherent surface plasmons are produced to provide said given gain.

20. The amplifier of claim 19 wherein said particular interaction results in a combination of (i) stimulated absorption of a fraction of said first mentioned surface plasmons, said stimulated absorption occurring with a stimulated absorption probability, and (ii) stimulated emission of said additional coherent surface plasmons, said stimulated emission occurring with a stimulated emission probability, and wherein said stimulated emission probability is greater than said stimulated absorption probability.

21. The amplifier of claim 11 wherein said output port includes an output antenna structure for emitting said output electromagnetic radiation.

22. The amplifier of claim 11 wherein said output port includes an output grating coupler for emitting said output electromagnetic radiation.

23. The amplifier of claim 11 wherein said output port includes an output evanescent wave coupler for emitting said output electromagnetic radiation.

24. The amplifier of claim 11 wherein said structure further includes an antireflection layer disposed between said input port and said tunneling junction.

25. The amplifier of claim 11 wherein said structure further includes an antireflection layer disposed between said tunneling junction and said output port.

26. An emitter comprising:
a) an input port configured to receive an input electrical current;
b) an output port; and
c) a structure including a tunneling junction connected with said input port and said output port, said tunneling junction including first and second non-insulating layers and an arrangement disposed between the first and second non-insulating layers, said arrangement being configured to serve as a transport of electrons between said first and second non-insulating layers and including at least two insulating layers, said tunneling junction being configured in a way (i) which causes said electrons to be in a particular energy state within said structure, (ii) which produces surface plasmons in response to said input electrical current, (iii) which causes said structure to act as a waveguide for directing at least a portion of said surface plasmons along a predetermined path toward said output port, and (iv) which produces at said output port an output electromagnetic radiation resulting from said particular interaction between said electrons and said surface plasmons.

27. The emitter of claim 26 wherein said arrangement further includes at least one additional non-insulating layer.

28. The emitter of claim 26 wherein at least one of said first and second non-insulating layers and said arrangement is formed by atomic layer deposition.

29. The emitter of claim 26 wherein said additional non-insulating layer is discontinuous.

30. The emitter of claim 26 wherein said output port includes an output antenna structure for emitting said output electromagnetic radiation.

31. The emitter of claim 26 wherein said output port includes an output grating coupler for emitting said output electromagnetic radiation.

32. The emitter of claim 26 wherein said output port includes an output evanescent wave coupler for emitting said output electromagnetic radiation.

33. The emitter of claim 26 wherein said particular interaction causes spontaneous emission of said surface plasmons to provide said output electromagnetic radiation.

34. The emitter of claim 33 wherein said surface plasmons produced by spontaneous emission are incoherent such that said output electromagnetic radiation is incoherent.

35. The emitter of claim 26 wherein said tunneling junction is further configured such that said tunneling of electrons produces additional surface plasmons so as to provide said output electromagnetic radiation with a given gain.

36. The emitter of claim 26 further comprising:
d) a reflective assembly configured to form a resonant cavity surrounding said structure, wherein said reflective assembly is configured for selectively confining at least a portion of said surface plasmons within said resonant cavity while selectively directing another portion of said surface plasmons toward said output port to provide said output electromagnetic radiation.

37. The emitter of claim 26 wherein said structure further includes an antireflection layer disposed between said tunneling junction and said output port.

38. A laser comprising:
a) an input port configured to receive an input electrical current;
b) an output port;
c) a structure including a tunneling junction connected with said input port and said output port, said tunneling junction being configured in a way (i) which provides electrons in a particular energy state within said structure and (ii) which produces surface plasmons in response to said input electrical current; and
d) a reflective assembly configured to form a resonant cavity surrounding said structure, wherein said reflective assembly is configured for selectively confining at least a portion of said surface plasmons within said resonant cavity while selectively directing another portion of said surface plasmons along a predetermined path toward said output port such that the surface plasmons so confined interact with said electrons in a particular way so as to produce an output electromagnetic radiation, wherein said output electromagnetic radiation results from said particular interaction between said electrons and said portion of surface plasmons confined within said resonant cavity.

39. The laser of claim 38 wherein said tunneling junction includes
a) first and second non-insulating layers spaced apart from one another, and
b) an arrangement disposed between the first and second non-insulating layers and configured to serve as a transport of electrons between said first and second non-insulating layers, said arrangement including at least two insulating layers.

40. The laser of claim 39 wherein said arrangement further includes at least one additional non-insulating layer.

41. The laser of claim 39 wherein at least one of said first and second non-insulating layers and said arrangement is formed by atomic layer deposition.

42. The laser of claim 40 wherein said additional non-insulating layer is discontinuous.

43. The laser of claim 38 wherein said particular interaction between said electrons and said surface plasmons causes at least a portion of said electrons to tunnel through said tunneling junction.

44. The laser of claim 38 wherein said tunneling junction is further configured such that said tunneling of electrons produces additional surface plasmons so as to provide a given gain.

45. The laser of claim 44 wherein said additional surface plasmons are produced by stimulated emission such that said output electromagnetic radiation is coherent.

46. The laser of claim 44 wherein said resonant cavity includes one or more cavity nodes, and wherein said tunneling junction is further configured to provide said given gain at least one of said cavity nodes.

47. The laser of claim 38 wherein said reflective assembly includes a partially transmitting output coupler for selectively directing said another portion of said surface plasmons along said predetermined path toward said output port.

48. A filter comprising:
   a) an input port configured to receive an input electromagnetic radiation over a range of frequencies;
   b) an output port;
   c) a structure including an insulating layer and a non-insulating layer disposed adjacent to said insulating layer such that an interface is defined between said insulating and non-insulating layers, said insulating and non-insulating layers being connected with said input port and said output port, said insulating and non-insulating layers being configured in a way which produces surface plasmons in response to said input electromagnetic radiation at said interface between said insulating and said non-insulating layers; and
   d) a reflective assembly configured to form a resonant cavity surrounding said structure, wherein said reflective assembly is configured for selectively confining at least a portion of said surface plasmons within said resonant cavity while selectively directing another portion of said surface plasmons along a predetermined path toward said output port so as to produce an output electromagnetic radiation having predetermined frequencies selected from within said range of frequencies.

49. The filter of claim 48 wherein said insulating layer includes an index of refraction and wherein said structure further includes a tuning arrangement for altering the index of refraction of said insulating layer such that said predetermined frequencies of said output electromagnetic radiation is tunable.

50. The filter of claim 48 wherein said structure includes a second non-insulating layer such that said insulating layer is disposed between said first mentioned, non-insulating layer and said second non-insulating layer to form a tunneling junction, said tunneling junction being configured in a way which provides electrons in a particular energy state within said structure between said first mentioned, non-insulating layer and said second non-insulating layer such that said output electromagnetic radiation results from a particular interaction between said electrons and said surface plasmons.

51. The filter of claim 50 wherein said particular interaction between said electrons and said surface plasmons causes electrons to tunnel through said tunneling junction.

52. The filter of claim 51 wherein said tunneling junction is further configured such that said tunneling of electrons results in additional surface plasmons to provide said output electromagnetic radiation with a given gain.

53. The filter of claim 52 further including an electro-optic arrangement positioned within said resonant cavity, said electro-optic arrangement including an electro-optic material having an index of refraction, and wherein said electro-optic arrangement is configured in a way which causes the index of refraction of said electro-optic material to be tunable such that said predetermined frequencies of said output electromagnetic radiation are in turn tunable.

54. A beamsplitter comprising:
   a) an input port configured to receive an input electromagnetic radiation, wherein a first portion of said input electromagnetic radiation is in a first polarization eigenstate, and wherein a second portion of said input electromagnetic radiation is in a second polarization eigenstate;
   b) first and second output ports; and
   c) a main body connected with said input port and said first and second output ports, said main body including a waveguide structure having a first path connected with said first output port and a second path connected with said second output port, said main body further including a conductive strip at least partially connecting said first and second paths, said main body being configured for separating said first portion of said input electromagnetic radiation from said second portion of said input electromagnetic radiation such that said first portion of said input electromagnetic radiation is directed along said first path toward said first output port as a first output electromagnetic radiation while said second portion of said input electromagnetic radiation is directed in a form of surface plasmons through said conductive strip and along said second path toward said second output port as a second output electromagnetic radiation.

55. A device comprising:
   a) an input port configured to receive an input signal in a form of slow mode surface plasmons;
   b) an output port; and
   c) a converter structure connected with said input port and said output port, said converter structure including first and second non-insulating layers, which are spaced apart from one another, and an arrangement disposed between the first and second non-insulating layers, said first non-insulating layer and said arrangement defining a first interface therebetween, said second non-insulating layer and said arrangement defining a second interface therebetween, said converter structure being configured in a way (i) which produces surface plasmons in response to said input signal, wherein a first portion of said slow mode surface plasmons travels along said first interface and a second portion of said slow mode surface plasmons travels along said second interface, (ii) which causes said converter structure to act as a waveguide for directing at least some of said first and second portions of said slow mode surface plasmons toward said output port, (iii) which introduces a 180° delay in phase between said first portion of said slow mode surface plasmons and said second portion of surface plasmons, and (iv) which combines said first and second portions of said slow mode surface plasmons, including said 180° delay in phase therebetween, so as to produce at said output port an output signal in a form of fast mode surface plasmons.

56. The device of claim 55 further comprising an antireflection layer disposed between said input port and said converter structure.

57. The device of claim 55 further comprising an antireflection layer disposed between said converter structure and said output port.

58. A method comprising:
a) providing an input port configured to receive an input signal;
b) providing an output port; and
c) providing a structure including a tunneling junction and connecting said tunneling junction with said input port and said output port, said tunneling junction
i) providing electrons in a particular state within said structure,
ii) causing said structure to produce surface plasmons in response to said input signal,
iii) causing said structure to act as a waveguide for directing at least a portion of the surface plasmons along a predetermined path toward said output port such that the surface plasmons so directed interact with said electrons in a particular way, and
iv) producing at said output port an output signal resulting from and in response to said particular interaction between said electrons and said surface plasmons, wherein said providing a structure including a tunneling junction includes forming said structure by atomic layer deposition.

59. A modulator comprising:
a) an input port configured to receive an input electromagnetic radiation;
b) an output port;
c) a signal source for providing a modulation signal; and
d) a structure including a tunneling junction connected with said input port and said output port, said tunneling junction being configured for receiving said modulation signal from said signal source, said tunneling junction being further configured in a way (i) which provides electrons in a particular energy state within said structure responsive to and as a function of said modulation signal, (ii) which produces surface plasmons in response to said input electromagnetic radiation, (iii) which causes said structure to act as a waveguide for directing at least a portion of said surface plasmons along a predetermined path toward said output port such that the surface plasmons so directed interact with said electrons in a particular way, and (iv) which produces at said output port an output electromagnetic radiation resulting from said particular interaction between said electrons and said surface plasmons such that said output electromagnetic radiation displays at least one characteristic that is a function of said modulation signal, wherein said tunneling junction is at least partially formed by atomic layer deposition.

* * * * *